(12) United States Patent
Fitzpatrick et al.

(10) Patent No.: US 9,520,197 B2
(45) Date of Patent: Dec. 13, 2016

(54) ADAPTIVE ERASE OF A STORAGE DEVICE

(71) Applicant: SanDisk Enterprise IP LLC, Milpitas, CA (US)

(72) Inventors: James Fitzpatrick, Sudbury, MA (US); James Higgins, Chandler, AZ (US); Li Li, Wellesley, MA (US); Mervyn Wongso, Gilbert, AZ (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 324 days.

(21) Appl. No.: 14/135,260

(22) Filed: Dec. 19, 2013

(65) Prior Publication Data

US 2015/0149699 A1 May 28, 2015

Related U.S. Application Data

(60) Provisional application No. 61/908,023, filed on Nov. 22, 2013.

(51) Int. Cl.
  *G11C 16/14* (2006.01)
  *G11C 16/34* (2006.01)
  *G11C 11/56* (2006.01)

(52) U.S. Cl.
  CPC .......... *G11C 16/14* (2013.01); *G11C 11/5635* (2013.01); *G11C 16/344* (2013.01); *G11C 16/349* (2013.01)

(58) Field of Classification Search
  CPC .............. G06F 11/0575; G06F 11/0754; G06F 12/0246; G06F 2212/7205; G06F 2212/2022; G06F 2212/1036; G11C 16/0483; G11C 16/10; G11C 16/16; G11C 16/26; G11C 16/3418; G11C 16/3454; G11C 16/344; G11C 16/349; G11C 16/14; G11C 13/0097
See application file for complete search history.

(56) References Cited

U.S. PATENT DOCUMENTS 4,173,737 A 11/1979 Skerlos et al.
4,888,750 A 12/1989 Kryder et al.
(Continued)

FOREIGN PATENT DOCUMENTS

EP 1 299 800 4/2003
EP 1465203 A1 10/2004
(Continued)

OTHER PUBLICATIONS

International Search Report and Written Opinion dated Jan. 21, 2015, received in International Application No. PCT/US2014/059748, which corresponds to U.S. Appl. No. 14/137,511, 13 pages (Dancho).

(Continued)

*Primary Examiner* — David X Yi
*Assistant Examiner* — Rocio Del Mar Perez-Velez
(74) *Attorney, Agent, or Firm* — Morgan, Lewis & Bockius LLP

(57) ABSTRACT

The various implementations described herein include systems, methods and/or devices used to enable adaptive erasure in a storage device. The method includes performing a plurality of memory operations including read operations and respective erase operations on portions of one or more non-volatile memory devices specified by the read operations and respective erase operations, where the respective erase operations are performed using a first set of erase parameters that has been established as a current set of erase parameters prior to performing the respective erase operations. The method includes, in accordance with each erase operation of at least a subset of the respective erase opera- (Continued)

tions, updating one or more erase statistics that correspond to performance of multiple erase operations. The method includes, in accordance with a comparison of the erase statistics with an erasure performance threshold, establishing a second set of erase parameters as the current set of erase parameters.

25 Claims, 9 Drawing Sheets

(56) References Cited

U.S. PATENT DOCUMENTS

| | | | |
|---|---|---|---|
| 4,916,652 A | 4/1990 | Schwarz et al. |
| 5,129,089 A | 7/1992 | Nielsen |
| 5,270,979 A | 12/1993 | Harari et al. |
| 5,329,491 A | 7/1994 | Brown et al. |
| 5,381,528 A | 1/1995 | Brunelle |
| 5,404,485 A | 4/1995 | Ban |
| 5,488,702 A | 1/1996 | Byers et al. |
| 5,519,847 A | 5/1996 | Fandrich et al. |
| 5,530,705 A | 6/1996 | Malone, Sr. |
| 5,537,555 A | 7/1996 | Landry et al. |
| 5,551,003 A | 8/1996 | Mattson et al. |
| 5,636,342 A | 6/1997 | Jeffries |
| 5,657,332 A | 8/1997 | Auclair et al. |
| 5,666,114 A | 9/1997 | Brodie et al. |
| 5,708,849 A | 1/1998 | Coke et al. |
| 5,765,185 A | 6/1998 | Lambrache et al. |
| 5,890,193 A | 3/1999 | Chevallier |
| 5,930,188 A | 7/1999 | Roohparvar |
| 5,936,884 A | 8/1999 | Hasbun et al. |
| 5,943,692 A | 8/1999 | Marberg et al. |
| 5,946,714 A | 8/1999 | Miyauchi |
| 5,982,664 A | 11/1999 | Watanabe |
| 6,000,006 A | 12/1999 | Bruce et al. |
| 6,006,345 A | 12/1999 | Berry, Jr. |
| 6,016,560 A | 1/2000 | Wada et al. |
| 6,018,304 A | 1/2000 | Bessios |
| 6,044,472 A | 3/2000 | Crohas |
| 6,070,074 A | 5/2000 | Perahia et al. |
| 6,104,304 A | 8/2000 | Clark et al. |
| 6,119,250 A | 9/2000 | Nishimura et al. |
| 6,138,261 A | 10/2000 | Wilcoxson et al. |
| 6,182,264 B1 | 1/2001 | Ott |
| 6,192,092 B1 | 2/2001 | Dizon et al. |
| 6,260,120 B1 | 7/2001 | Blumenau et al. |
| 6,295,592 B1 | 9/2001 | Jeddeloh |
| 6,311,263 B1 | 10/2001 | Barlow et al. |
| 6,408,394 B1 | 6/2002 | Vander Kamp et al. |
| 6,412,042 B1 | 6/2002 | Paterson et al. |
| 6,442,076 B1 | 8/2002 | Roohparvar |
| 6,449,625 B1 | 9/2002 | Wang |
| 6,484,224 B1 | 11/2002 | Robins et al. |
| 6,516,437 B1 | 2/2003 | Van Stralen et al. |
| 6,564,285 B1 | 5/2003 | Mills et al. |
| 6,647,387 B1 | 11/2003 | McKean et al. |
| 6,678,788 B1 | 1/2004 | O'Connell |
| 6,728,879 B1 | 4/2004 | Atkinson |
| 6,757,768 B1 | 6/2004 | Potter et al. |
| 6,775,792 B2 | 8/2004 | Ulrich et al. |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,865,650 B1 | 3/2005 | Morley et al. |
| 6,871,257 B2 | 3/2005 | Conley et al. |
| 6,895,464 B2 | 5/2005 | Chow et al. |
| 6,966,006 B2 | 11/2005 | Pacheco et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,024,514 B2 | 4/2006 | Mukaida et al. |
| 7,028,165 B2 | 4/2006 | Roth et al. |
| 7,032,123 B2 | 4/2006 | Kane et al. |
| 7,043,505 B1 | 5/2006 | Teague et al. |
| 7,076,598 B2 | 7/2006 | Wang |
| 7,100,002 B2 | 8/2006 | Shrader |
| 7,102,860 B2 | 9/2006 | Wenzel |
| 7,111,293 B1 | 9/2006 | Hersh et al. |
| 7,126,873 B2 | 10/2006 | See et al. |
| 7,133,282 B2 | 11/2006 | Sone |
| 7,155,579 B1 | 12/2006 | Neils et al. |
| 7,162,678 B2 | 1/2007 | Saliba |
| 7,173,852 B2 | 2/2007 | Gorobets et al. |
| 7,184,446 B2 | 2/2007 | Rashid et al. |
| 7,212,440 B2 | 5/2007 | Gorobets |
| 7,275,170 B2 | 9/2007 | Suzuki |
| 7,295,479 B2 | 11/2007 | Yoon et al. |
| 7,328,377 B1 | 2/2008 | Lewis et al. |
| 7,486,561 B2 | 2/2009 | Mokhlesi |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,533,214 B2 | 5/2009 | Aasheim et al. |
| 7,546,478 B2 | 6/2009 | Kubo et al. |
| 7,566,987 B2 | 7/2009 | Black et al. |
| 7,571,277 B2 | 8/2009 | Mizushima |
| 7,574,554 B2 | 8/2009 | Tanaka et al. |
| 7,596,643 B2 | 9/2009 | Merry, Jr. et al. |
| 7,669,003 B2 | 2/2010 | Sinclair et al. |
| 7,681,106 B2 | 3/2010 | Jarrar et al. |
| 7,685,494 B1 | 3/2010 | Varnica et al. |
| 7,707,481 B2 | 4/2010 | Kirschner et al. |
| 7,761,655 B2 | 7/2010 | Mizushima et al. |
| 7,765,454 B2 | 7/2010 | Passint |
| 7,774,390 B2 | 8/2010 | Shin |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,945,825 B2 | 5/2011 | Cohen et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich et al. |
| 7,996,642 B1 | 8/2011 | Smith |
| 8,006,161 B2 | 8/2011 | Lestable et al. |
| 8,032,724 B1 | 10/2011 | Smith |
| 8,041,884 B2 | 10/2011 | Chang |
| 8,042,011 B2 | 10/2011 | Nicolaidis et al. |
| 8,069,390 B2 | 11/2011 | Lin |
| 8,190,967 B2 | 5/2012 | Hong et al. |
| 8,250,380 B2 | 8/2012 | Guyot |
| 8,254,181 B2 | 8/2012 | Hwang et al. |
| 8,259,506 B1 | 9/2012 | Sommer et al. |
| 8,261,020 B2 | 9/2012 | Krishnaprasad et al. |
| 8,312,349 B2 | 11/2012 | Reche et al. |
| 8,385,117 B2 | 2/2013 | Sakurada et al. |
| 8,412,985 B1 | 4/2013 | Bowers et al. |
| 8,429,436 B2 | 4/2013 | Fillingim et al. |
| 8,438,459 B2 | 5/2013 | Cho et al. |
| 8,453,022 B2 | 5/2013 | Katz |
| 8,510,499 B1 | 8/2013 | Banerjee |
| 8,531,888 B2 | 9/2013 | Chilappagari et al. |
| 8,554,984 B2 | 10/2013 | Yano et al. |
| 8,627,117 B2 | 1/2014 | Johnston |
| 8,634,248 B1 | 1/2014 | Sprouse et al. |
| 8,694,854 B1 | 4/2014 | Dar et al. |
| 8,724,789 B2 | 5/2014 | Altberg et al. |
| 8,832,384 B1 | 9/2014 | de la Iglesia |
| 8,874,992 B2 | 10/2014 | Desireddi et al. |
| 8,885,434 B2 | 11/2014 | Kumar |
| 8,898,373 B1 | 11/2014 | Kang et al. |
| 8,909,894 B1 | 12/2014 | Singh et al. |
| 8,910,030 B2 | 12/2014 | Goel |
| 8,923,066 B1 | 12/2014 | Subramanian et al. |
| 9,043,517 B1 | 5/2015 | Sprouse et al. |
| 9,128,690 B2 | 9/2015 | Lotzenburger et al. |

(56) References Cited

U.S. PATENT DOCUMENTS

| | | |
|---|---|---|
| 9,329,789 B1 | 5/2016 | Chu et al. |
| 2001/0026949 A1 | 10/2001 | Ogawa et al. |
| 2001/0050824 A1 | 12/2001 | Buch |
| 2002/0024846 A1 | 2/2002 | Kawahara et al. |
| 2002/0032891 A1 | 3/2002 | Yada et al. |
| 2002/0036515 A1 | 3/2002 | Eldridge et al. |
| 2002/0083299 A1 | 6/2002 | Van Huben et al. |
| 2002/0099904 A1 | 7/2002 | Conley |
| 2002/0116651 A1 | 8/2002 | Beckert et al. |
| 2002/0122334 A1 | 9/2002 | Lee et al. |
| 2002/0152305 A1 | 10/2002 | Jackson et al. |
| 2002/0162075 A1 | 10/2002 | Talagala et al. |
| 2002/0165896 A1 | 11/2002 | Kim |
| 2003/0041299 A1 | 2/2003 | Kanazawa et al. |
| 2003/0043829 A1 | 3/2003 | Rashid et al. |
| 2003/0079172 A1 | 4/2003 | Yamagishi et al. |
| 2003/0088805 A1 | 5/2003 | Majni et al. |
| 2003/0093628 A1 | 5/2003 | Matter et al. |
| 2003/0163594 A1 | 8/2003 | Aasheim et al. |
| 2003/0163629 A1 | 8/2003 | Conley et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0204341 A1 | 10/2003 | Guliani et al. |
| 2003/0212719 A1 | 11/2003 | Yasuda et al. |
| 2003/0225961 A1 | 12/2003 | Chow et al. |
| 2004/0024957 A1 | 2/2004 | Lin et al. |
| 2004/0024963 A1 | 2/2004 | Talagala et al. |
| 2004/0057575 A1 | 3/2004 | Zhang et al. |
| 2004/0062157 A1 | 4/2004 | Kawabe |
| 2004/0073829 A1 | 4/2004 | Olarig |
| 2004/0085849 A1 | 5/2004 | Myoung et al. |
| 2004/0114265 A1 | 6/2004 | Talbert |
| 2004/0143710 A1 | 7/2004 | Walmsley |
| 2004/0148561 A1 | 7/2004 | Shen et al. |
| 2004/0153902 A1 | 8/2004 | Machado et al. |
| 2004/0158775 A1 | 8/2004 | Shibuya et al. |
| 2004/0167898 A1 | 8/2004 | Margolus et al. |
| 2004/0181734 A1 | 9/2004 | Saliba |
| 2004/0199714 A1 | 10/2004 | Estakhri et al. |
| 2004/0210706 A1 | 10/2004 | In et al. |
| 2004/0237018 A1 | 11/2004 | Riley |
| 2005/0060456 A1 | 3/2005 | Shrader et al. |
| 2005/0060501 A1 | 3/2005 | Shrader |
| 2005/0073884 A1 | 4/2005 | Gonzalez et al. |
| 2005/0108588 A1 | 5/2005 | Yuan |
| 2005/0114587 A1 | 5/2005 | Chou et al. |
| 2005/0138442 A1 | 6/2005 | Keller, Jr. et al. |
| 2005/0144358 A1 | 6/2005 | Conley et al. |
| 2005/0144361 A1 | 6/2005 | Gonzalez et al. |
| 2005/0144367 A1 | 6/2005 | Sinclair |
| 2005/0144516 A1 | 6/2005 | Gonzalez et al. |
| 2005/0154825 A1 | 7/2005 | Fair |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0210348 A1 | 9/2005 | Totsuka |
| 2005/0231765 A1 | 10/2005 | So et al. |
| 2005/0249013 A1 | 11/2005 | Janzen et al. |
| 2005/0251617 A1 | 11/2005 | Sinclair et al. |
| 2005/0257120 A1 | 11/2005 | Gorobets et al. |
| 2005/0273560 A1 | 12/2005 | Hulbert et al. |
| 2005/0281088 A1 | 12/2005 | Ishidoshiro et al. |
| 2005/0289314 A1 | 12/2005 | Adusumilli et al. |
| 2006/0010174 A1 | 1/2006 | Nguyen et al. |
| 2006/0039196 A1 | 2/2006 | Gorobets et al. |
| 2006/0039227 A1 | 2/2006 | Lai et al. |
| 2006/0053246 A1 | 3/2006 | Lee |
| 2006/0062054 A1 | 3/2006 | Hamilton et al. |
| 2006/0069932 A1 | 3/2006 | Oshikawa et al. |
| 2006/0085671 A1 | 4/2006 | Majni et al. |
| 2006/0087893 A1 | 4/2006 | Nishihara et al. |
| 2006/0103480 A1 | 5/2006 | Moon et al. |
| 2006/0107181 A1 | 5/2006 | Dave et al. |
| 2006/0136570 A1 | 6/2006 | Pandya |
| 2006/0136655 A1 | 6/2006 | Gorobets et al. |
| 2006/0136681 A1 | 6/2006 | Jain et al. |
| 2006/0156177 A1 | 7/2006 | Kottapalli et al. |
| 2006/0184738 A1 | 8/2006 | Bridges et al. |
| 2006/0195650 A1 | 8/2006 | Su et al. |
| 2006/0209592 A1 | 9/2006 | Li et al. |
| 2006/0224841 A1 | 10/2006 | Terai et al. |
| 2006/0244049 A1 | 11/2006 | Yaoi et al. |
| 2006/0259528 A1 | 11/2006 | Dussud et al. |
| 2006/0265568 A1 | 11/2006 | Burton |
| 2006/0291301 A1 | 12/2006 | Ziegelmayer |
| 2007/0011413 A1 | 1/2007 | Nonaka et al. |
| 2007/0033376 A1 | 2/2007 | Sinclair et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0088716 A1 | 4/2007 | Brumme et al. |
| 2007/0091677 A1 | 4/2007 | Lasser et al. |
| 2007/0101096 A1 | 5/2007 | Gorobets |
| 2007/0106679 A1 | 5/2007 | Perrin et al. |
| 2007/0113019 A1 | 5/2007 | Beukema et al. |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0156842 A1 | 7/2007 | Vermeulen et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0180346 A1 | 8/2007 | Murin |
| 2007/0191993 A1 | 8/2007 | Wyatt |
| 2007/0201274 A1 | 8/2007 | Yu et al. |
| 2007/0204128 A1 | 8/2007 | Lee et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0245099 A1 | 10/2007 | Gray et al. |
| 2007/0263442 A1 | 11/2007 | Cornwell et al. |
| 2007/0268754 A1 | 11/2007 | Lee et al. |
| 2007/0277036 A1 | 11/2007 | Chamberlain et al. |
| 2007/0279988 A1 | 12/2007 | Nguyen |
| 2007/0291556 A1 | 12/2007 | Kamei |
| 2007/0294496 A1 | 12/2007 | Goss et al. |
| 2007/0300130 A1 | 12/2007 | Gorobets |
| 2008/0013390 A1 | 1/2008 | Zipprich-Rasch |
| 2008/0019182 A1 | 1/2008 | Yanagidaira et al. |
| 2008/0022163 A1 | 1/2008 | Tanaka et al. |
| 2008/0028275 A1 | 1/2008 | Chen et al. |
| 2008/0043871 A1 | 2/2008 | Latouche et al. |
| 2008/0052446 A1 | 2/2008 | Lasser et al. |
| 2008/0052451 A1 | 2/2008 | Pua et al. |
| 2008/0056005 A1 | 3/2008 | Aritome |
| 2008/0059602 A1 | 3/2008 | Matsuda et al. |
| 2008/0071971 A1 | 3/2008 | Kim et al. |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0112226 A1 | 5/2008 | Mokhlesi |
| 2008/0141043 A1 | 6/2008 | Flynn et al. |
| 2008/0144371 A1 | 6/2008 | Yeh et al. |
| 2008/0147714 A1 | 6/2008 | Breternitz et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0180084 A1 | 7/2008 | Dougherty et al. |
| 2008/0209282 A1 | 8/2008 | Lee et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313132 A1 | 12/2008 | Hao et al. |

(56) References Cited

U.S. PATENT DOCUMENTS

| | | |
|---|---|---|
| 2009/0003046 A1 | 1/2009 | Nirschl et al. |
| 2009/0003058 A1 | 1/2009 | Kang |
| 2009/0019216 A1 | 1/2009 | Yamada et al. |
| 2009/0031083 A1 | 1/2009 | Willis et al. |
| 2009/0037652 A1 | 2/2009 | Yu et al. |
| 2009/0070608 A1 | 3/2009 | Kobayashi |
| 2009/0116283 A1 | 5/2009 | Ha et al. |
| 2009/0125671 A1 | 5/2009 | Flynn et al. |
| 2009/0144598 A1 | 6/2009 | Yoon et al. |
| 2009/0158288 A1 | 6/2009 | Fulton et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0204823 A1 | 8/2009 | Giordano et al. |
| 2009/0207660 A1 | 8/2009 | Hwang et al. |
| 2009/0213649 A1 | 8/2009 | Takahashi et al. |
| 2009/0222708 A1 | 9/2009 | Yamaga |
| 2009/0228761 A1 | 9/2009 | Perlmutter et al. |
| 2009/0235128 A1 | 9/2009 | Eun et al. |
| 2009/0249160 A1 | 10/2009 | Gao et al. |
| 2009/0268521 A1 | 10/2009 | Ueno et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0310422 A1 | 12/2009 | Edahiro et al. |
| 2009/0319864 A1 | 12/2009 | Shrader |
| 2010/0002506 A1 | 1/2010 | Cho et al. |
| 2010/0008175 A1 | 1/2010 | Sweere et al. |
| 2010/0011261 A1 | 1/2010 | Cagno et al. |
| 2010/0020620 A1 | 1/2010 | Kim et al. |
| 2010/0037012 A1 | 2/2010 | Yano et al. |
| 2010/0054034 A1 | 3/2010 | Furuta et al. |
| 2010/0061151 A1 | 3/2010 | Miwa et al. |
| 2010/0091535 A1 | 4/2010 | Sommer et al. |
| 2010/0103737 A1 | 4/2010 | Park |
| 2010/0110798 A1 | 5/2010 | Hoei et al. |
| 2010/0115206 A1 | 5/2010 | de la Iglesia et al. |
| 2010/0118608 A1 | 5/2010 | Song et al. |
| 2010/0138592 A1 | 6/2010 | Cheon |
| 2010/0153616 A1 | 6/2010 | Garratt |
| 2010/0161936 A1 | 6/2010 | Royer et al. |
| 2010/0174959 A1 | 7/2010 | No et al. |
| 2010/0185807 A1 | 7/2010 | Meng et al. |
| 2010/0199027 A1 | 8/2010 | Pucheral et al. |
| 2010/0199125 A1 | 8/2010 | Reche |
| 2010/0199138 A1 | 8/2010 | Rho |
| 2010/0202196 A1 | 8/2010 | Lee et al. |
| 2010/0202239 A1 | 8/2010 | Moshayedi et al. |
| 2010/0208521 A1 | 8/2010 | Kim et al. |
| 2010/0257379 A1 | 10/2010 | Wang et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0306222 A1 | 12/2010 | Freedman et al. |
| 2010/0332858 A1 | 12/2010 | Trantham et al. |
| 2010/0332863 A1 | 12/2010 | Johnston |
| 2011/0010514 A1 | 1/2011 | Benhase et al. |
| 2011/0022779 A1 | 1/2011 | Lund et al. |
| 2011/0022819 A1 | 1/2011 | Post et al. |
| 2011/0051513 A1 | 3/2011 | Shen et al. |
| 2011/0066597 A1 | 3/2011 | Mashtizadeh et al. |
| 2011/0066806 A1 | 3/2011 | Chhugani et al. |
| 2011/0072207 A1 | 3/2011 | Jin et al. |
| 2011/0072302 A1 | 3/2011 | Sartore |
| 2011/0078407 A1 | 3/2011 | Lewis |
| 2011/0078496 A1 | 3/2011 | Jeddeloh |
| 2011/0083060 A1 | 4/2011 | Sakurada et al. |
| 2011/0099460 A1 | 4/2011 | Dusija et al. |
| 2011/0113281 A1 | 5/2011 | Zhang et al. |
| 2011/0122691 A1 | 5/2011 | Sprouse |
| 2011/0131444 A1 | 6/2011 | Buch et al. |
| 2011/0138260 A1 | 6/2011 | Savin |
| 2011/0173378 A1 | 7/2011 | Filor et al. |
| 2011/0179249 A1 | 7/2011 | Hsiao |
| 2011/0199825 A1 | 8/2011 | Han et al. |
| 2011/0205823 A1 | 8/2011 | Hemink et al. |
| 2011/0213920 A1 | 9/2011 | Frost et al. |
| 2011/0222342 A1 | 9/2011 | Yoon et al. |
| 2011/0225346 A1 | 9/2011 | Goss et al. |
| 2011/0228601 A1 | 9/2011 | Olbrich et al. |
| 2011/0231600 A1 | 9/2011 | Tanaka et al. |
| 2011/0239077 A1 | 9/2011 | Bai et al. |
| 2011/0264843 A1 | 10/2011 | Haines et al. |
| 2011/0271040 A1 | 11/2011 | Kamizono |
| 2011/0283119 A1 | 11/2011 | Szu et al. |
| 2011/0289125 A1 | 11/2011 | Guthery |
| 2011/0320733 A1 | 12/2011 | Sanford et al. |
| 2012/0011393 A1 | 1/2012 | Roberts et al. |
| 2012/0017053 A1 | 1/2012 | Yang et al. |
| 2012/0023144 A1 | 1/2012 | Rub |
| 2012/0026799 A1 | 2/2012 | Lee |
| 2012/0054414 A1 | 3/2012 | Tsai et al. |
| 2012/0063234 A1 | 3/2012 | Shiga et al. |
| 2012/0072639 A1 | 3/2012 | Goss et al. |
| 2012/0096217 A1 | 4/2012 | Son et al. |
| 2012/0110250 A1 | 5/2012 | Sabbag et al. |
| 2012/0117317 A1 | 5/2012 | Sheffler |
| 2012/0117397 A1 | 5/2012 | Kolvick et al. |
| 2012/0124273 A1 | 5/2012 | Goss et al. |
| 2012/0131286 A1 | 5/2012 | Faith et al. |
| 2012/0151124 A1 | 6/2012 | Baek et al. |
| 2012/0151253 A1 | 6/2012 | Horn |
| 2012/0151294 A1 | 6/2012 | Yoo et al. |
| 2012/0173797 A1 | 7/2012 | Shen |
| 2012/0173826 A1 | 7/2012 | Takaku |
| 2012/0185750 A1 | 7/2012 | Hayami |
| 2012/0195126 A1 | 8/2012 | Roohparvar |
| 2012/0203804 A1 | 8/2012 | Burka et al. |
| 2012/0203951 A1 | 8/2012 | Wood et al. |
| 2012/0210095 A1 | 8/2012 | Nellans et al. |
| 2012/0216079 A1 | 8/2012 | Fai et al. |
| 2012/0233391 A1 | 9/2012 | Frost et al. |
| 2012/0236658 A1 | 9/2012 | Byom et al. |
| 2012/0239858 A1 | 9/2012 | Melik-Martirosian |
| 2012/0239868 A1 | 9/2012 | Ryan et al. |
| 2012/0239976 A1 | 9/2012 | Cometti et al. |
| 2012/0246204 A1 | 9/2012 | Nalla et al. |
| 2012/0259863 A1 | 10/2012 | Bodwin et al. |
| 2012/0275466 A1 | 11/2012 | Bhadra et al. |
| 2012/0278564 A1 | 11/2012 | Goss et al. |
| 2012/0284574 A1 | 11/2012 | Avila et al. |
| 2012/0284587 A1 | 11/2012 | Yu et al. |
| 2012/0297122 A1 | 11/2012 | Gorobets |
| 2013/0007073 A1 | 1/2013 | Varma |
| 2013/0007343 A1 | 1/2013 | Rub et al. |
| 2013/0007381 A1 | 1/2013 | Palmer |
| 2013/0007543 A1 | 1/2013 | Goss et al. |
| 2013/0024735 A1 | 1/2013 | Chung et al. |
| 2013/0031438 A1 | 1/2013 | Hu et al. |
| 2013/0036418 A1 | 2/2013 | Yadappanavar et al. |
| 2013/0038380 A1 | 2/2013 | Cordero et al. |
| 2013/0047045 A1 | 2/2013 | Hu et al. |
| 2013/0058145 A1 | 3/2013 | Yu et al. |
| 2013/0070527 A1* | 3/2013 | Sabbag ............... G11C 16/14 365/185.11 |
| 2013/0073784 A1 | 3/2013 | Ng et al. |
| 2013/0073798 A1 | 3/2013 | Kang et al. |
| 2013/0073924 A1 | 3/2013 | D'Abreu et al. |
| 2013/0079942 A1 | 3/2013 | Smola et al. |
| 2013/0086131 A1 | 4/2013 | Hunt et al. |
| 2013/0086132 A1 | 4/2013 | Hunt et al. |
| 2013/0094288 A1 | 4/2013 | Patapoutian et al. |
| 2013/0103978 A1 | 4/2013 | Akutsu |
| 2013/0111279 A1 | 5/2013 | Jeon et al. |
| 2013/0111298 A1 | 5/2013 | Seroff et al. |
| 2013/0117606 A1 | 5/2013 | Anholt et al. |
| 2013/0121084 A1 | 5/2013 | Jeon et al. |

(56) References Cited

U.S. PATENT DOCUMENTS

| | | | |
|---|---|---|---|
| 2013/0124792 A1* | 5/2013 | Melik-Martirosian | G11C 16/14 711/103 |
| 2013/0124888 A1 | 5/2013 | Tanaka et al. | |
| 2013/0128666 A1 | 5/2013 | Avila et al. | |
| 2013/0132647 A1 | 5/2013 | Melik-Martirosian | |
| 2013/0132652 A1 | 5/2013 | Wood et al. | |
| 2013/0159609 A1 | 6/2013 | Haas et al. | |
| 2013/0176784 A1 | 7/2013 | Cometti et al. | |
| 2013/0179646 A1 | 7/2013 | Okubo et al. | |
| 2013/0191601 A1 | 7/2013 | Peterson et al. | |
| 2013/0194865 A1 | 8/2013 | Bandic et al. | |
| 2013/0194874 A1 | 8/2013 | Mu et al. | |
| 2013/0232289 A1 | 9/2013 | Zhong et al. | |
| 2013/0238576 A1 | 9/2013 | Binkert et al. | |
| 2013/0254498 A1 | 9/2013 | Adachi et al. | |
| 2013/0254507 A1 | 9/2013 | Islam et al. | |
| 2013/0258738 A1 | 10/2013 | Barkon et al. | |
| 2013/0265838 A1 | 10/2013 | Li | |
| 2013/0282955 A1 | 10/2013 | Parker et al. | |
| 2013/0290611 A1 | 10/2013 | Biederman et al. | |
| 2013/0297613 A1 | 11/2013 | Yu | |
| 2013/0301373 A1 | 11/2013 | Tam | |
| 2013/0304980 A1 | 11/2013 | Nachimuthu et al. | |
| 2013/0314988 A1 | 11/2013 | Desireddi et al. | |
| 2013/0343131 A1 | 12/2013 | Wu et al. | |
| 2013/0346672 A1 | 12/2013 | Sengupta et al. | |
| 2014/0013027 A1 | 1/2014 | Jannyavula Venkata et al. | |
| 2014/0013188 A1 | 1/2014 | Wu et al. | |
| 2014/0025864 A1 | 1/2014 | Zhang et al. | |
| 2014/0032890 A1 | 1/2014 | Lee et al. | |
| 2014/0063905 A1 | 3/2014 | Ahn et al. | |
| 2014/0067761 A1 | 3/2014 | Chakrabarti et al. | |
| 2014/0071761 A1 | 3/2014 | Sharon et al. | |
| 2014/0075133 A1 | 3/2014 | Li et al. | |
| 2014/0082261 A1 | 3/2014 | Cohen et al. | |
| 2014/0082310 A1 | 3/2014 | Nakajima | |
| 2014/0082456 A1 | 3/2014 | Li et al. | |
| 2014/0082459 A1 | 3/2014 | Li et al. | |
| 2014/0095775 A1 | 4/2014 | Talagala et al. | |
| 2014/0101389 A1 | 4/2014 | Nellans et al. | |
| 2014/0115238 A1 | 4/2014 | Xi et al. | |
| 2014/0122818 A1 | 5/2014 | Hayasaka et al. | |
| 2014/0122907 A1 | 5/2014 | Johnston | |
| 2014/0136762 A1 | 5/2014 | Li et al. | |
| 2014/0136883 A1 | 5/2014 | Cohen | |
| 2014/0136927 A1 | 5/2014 | Li et al. | |
| 2014/0143505 A1 | 5/2014 | Sim et al. | |
| 2014/0153333 A1 | 6/2014 | Avila et al. | |
| 2014/0157065 A1 | 6/2014 | Ong | |
| 2014/0173162 A1 | 6/2014 | Fleischer et al. | |
| 2014/0181458 A1 | 6/2014 | Loh et al. | |
| 2014/0201596 A1 | 7/2014 | Baum et al. | |
| 2014/0223084 A1 | 8/2014 | Lee et al. | |
| 2014/0244578 A1 | 8/2014 | Winkelstraeter | |
| 2014/0258755 A1 | 9/2014 | Stenfort | |
| 2014/0269090 A1 | 9/2014 | Flynn et al. | |
| 2014/0310494 A1 | 10/2014 | Higgins et al. | |
| 2014/0359381 A1 | 12/2014 | Takeuchi et al. | |
| 2015/0023097 A1 | 1/2015 | Khoueir et al. | |
| 2015/0032967 A1 | 1/2015 | Udayashankar et al. | |
| 2015/0037624 A1 | 2/2015 | Thompson et al. | |
| 2015/0153799 A1 | 6/2015 | Lucas et al. | |
| 2015/0153802 A1 | 6/2015 | Lucas et al. | |
| 2015/0212943 A1 | 7/2015 | Yang et al. | |
| 2015/0268879 A1 | 9/2015 | Chu | |
| 2015/0286438 A1 | 10/2015 | Simionescu et al. | |

FOREIGN PATENT DOCUMENTS

| | | |
|---|---|---|
| EP | 1 990 921 A2 | 11/2008 |
| EP | 2 386 958 A1 | 11/2011 |
| EP | 2 620 946 A2 | 7/2013 |
| JP | 2002-532806 S | 10/2002 |
| WO | WO 2007/036834 A2 | 4/2007 |
| WO | WO 2007/080586 A2 | 7/2007 |
| WO | WO 2008/075292 | 6/2008 |
| WO | WO 2008/121553 A1 | 10/2008 |
| WO | WO 2008/121577 A1 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 A1 | 11/2009 |
| WO | WO 2011/024015 | 3/2011 |

OTHER PUBLICATIONS

International Search Report and Written Opinion dated Feb. 18, 2015, received in International Application No. PCT/US2014/066921, which corresponds to U.S. Appl. No. 14/135,260, 13 pages (Fitzpatrick).

Invitation to Pay Additional Fees dated Feb. 13, 2015, received in International Application No. PCT/US2014/063949, which corresponds to U.S. Appl. No. 14/135,433, 6 pages (Delpapa).

Ashkenazi et al., "Platform independent overall security architecture in multi-processor system-on-chip integrated circuits for use in mobile phones and handheld devices," ScienceDirect, Computers and Electrical Engineering 33 (2007), 18 pages.

Lee et al., "A Semi-Preemptive Garbage Collector for Solid State Drives," Apr. 2011, IEEE, pp. 12-21.

Office Action dated Feb. 17, 2015, received in Chinese Patent Application No. 201210334987.1, which corresponds to U.S. Appl. No. 12/082,207, 9 pages (Prins).

International Search Report and Written Opinion dated May 4, 2015, received in International Patent Application No. PCT/US2014/065987, which corresponds to U.S. Appl. No. 14/135,400, 12 pages (George).

International Search Report and Written Opinion dated Mar. 17, 2015, received in International Patent Application No. PCT/US2014/067487, which corresponds to U.S. Appl. No. 14/135,420, 13 pages (Lucas).

International Search Report and Written Opinion dated Apr. 20, 2015, received in International Patent Application No. PCT/US2014/063949, which corresponds to U.S. Appl. No. 14/135,433, 21 pages (Delpapa).

International Search Report and Written Opinion dated Mar. 9, 2015, received in International Patent Application No. PCT/US2014/059747, which corresponds to U.S. Appl. No. 14/137,440, 9 pages (Fitzpatrick).

Bayer, "Prefix B—Trees", ip.com Journal, ip.com Inc., West Henrietta, NY, Mar. 30, 2007, 29 pages.

Bhattacharjee et al., "Efficient Index Compression in DB2 LUW", IBM Research Report, Jun. 23, 2009, http://domino.research.ibm.com/library/cyberdig.nsf/papers/40B2C45876D0D747852575E100620CE7/$File/rc24815.pdf, 13 pages.

Oracle, "Oracle9i: Database Concepts", Jul. 2001, http://docs.oracle.com/cd/A91202_01/901_doc/server.901/a88856.pdf, 49 pages.

International Search Report and Written Opinion dated Jun. 8, 2015, received in International Patent Application No. PCT/US2015/018252, which corresponds to U.S. Appl. No. 14/339,072, 9 pages (Busch).

International Search Report and Written Opinion dated Jun. 2, 2015, received in International Patent Application No. PCT/US2015/018255, which corresponds to U.S. Appl. No. 14/336,967, 14 pages (Chander).

International Search Report and Written Opinion dated Jun. 30, 2015, received in International Patent Application No. PCT/US2015/023927, which corresponds to U.S. Appl. No. 14/454,687, 11 pages (Kadayam).

International Search Report and Written Opinion dated Jul. 23, 2015, received in International Patent Application No. PCT/US2015/030850, which corresponds to U.S. Appl. No. 14/298,843, 12 pages (Ellis).

(56) References Cited

OTHER PUBLICATIONS

Office Action dated Dec. 8, 2014, received in Chinese Patent Application No. 201180021660.2, which corresponds to U.S. Appl. No. 12/726,200, 7 pages (Olbrich).
Office Action dated Jul. 31, 2015, received in Chinese Patent Application No. 201180021660.2, which corresponds to U.S. Appl. No. 12/726,200, 9 pages (Olbrich).
International Search Report and Written Opinion dated Sep. 14, 2015, received in International Patent Application No. PCT/US2015/036807, which corresponds to U.S. Appl. No. 14/311,152, 9 pages (Higgins).
International Search Report and Written Opinion dated Jul. 25, 2014, received in International Patent Application No. PCT/US2014/029453, which corresponds to U.S. Appl. No. 13/963,444, 9 pages (Frayer).
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
IBM Research-Zurich, "The Fundamental Limit of Flash Random Write Performance: Understanding, Analysis and Performance Modeling," Mar. 31, 2010, pp. 1-15.
Gasior, "Gigabyte's i-Ram storage device, Ram disk without the fuss," The Tech Report, p. 1, Jan. 25, 2006, 5 pages.
Barr, Introduction to Watchdog Timers, Oct. 2001, 3 pgs.
Canim, Buffered Bloom ilters on Solid State Storage, ADMS*10, Singapore, Sep. 13-17, 2010, 8 pgs.
Kang, A Multi-Channel Architecture for High-Performance NAND Flash-Based Storage System, J. Syst. Archit., 53, 9, Sep. 2007, 15 pgs.
Kim, A Space-Efficient Flash Translation Layer for CompactFlash Systems, May 2002, 10 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
McLean, Information Technology—AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
Pliant Technology, International Search Report / Written Opinion, PCT/US08/88133, Mar. 19, 2009, 7 pgs.
Pliant Technology, International Search Report / Written Opinion, PCT/US08/88136, Mar. 19, 2009, 7 pgs.
Pliant Technology, International Search Report / Written Opinion, PCT/US08/88146, Feb. 26, 2009, 10 pgs.
Pliant Technology, International Search Report / Written Opinion, PCT/US08/88154, Feb. 27, 2009, 8 pgs.
Pliant Technology, International Search Report / Written Opinion, PCT/US08/88164, Feb. 13, 2009, 6 pgs.
Pliant Technology, International Search Report / Written Opinion, PCT/US08/88206, Feb. 18, 2009, 8 pgs.
Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 7 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, Oct. 27, 2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
Sandisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.
Oestreicher et al., "Object Lifetimes in Java Card," 1999, USENIX, 10 pages.
Office Action dated Apr. 25, 2016, received in Chinese Patent Application No. 201280066282.4, which corresponds to U.S. Appl. No. 13/602,047, 8 pages (Tai).
International Preliminary Report on Patentability dated May 24, 2016, received in International Patent Application No. PCT/US2014/065987, which corresponds to U.S. Appl. No. 14/135,400, 9 pages (George).

* cited by examiner

ADAPTIVE ERASE OF A STORAGE DEVICE

RELATED APPLICATION

This application claims priority to U.S. Provisional Patent Application Ser. No. 61/908,023, filed Nov. 22, 2013, entitled "Adaptive Erase of a Storage Device," which is herein incorporated by reference in its entirety.

TECHNICAL FIELD

The disclosed embodiments relate generally to memory systems, and in particular, to adaptive erasure in memory devices.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information.

Writing data to some types of non-volatile memory, including flash memory requires erasing one or more portions of the memory before writing the data to those portions of the memory. Typically, erasing the one or more portions of the memory is accomplished by applying a voltage to the one or more portions of the memory to be erased. As memory goes through repeated cycles of writes and erasures, it gets worn by the application of repeated, high voltage erase operations.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to enable adaptive erasure in memory devices.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1A:
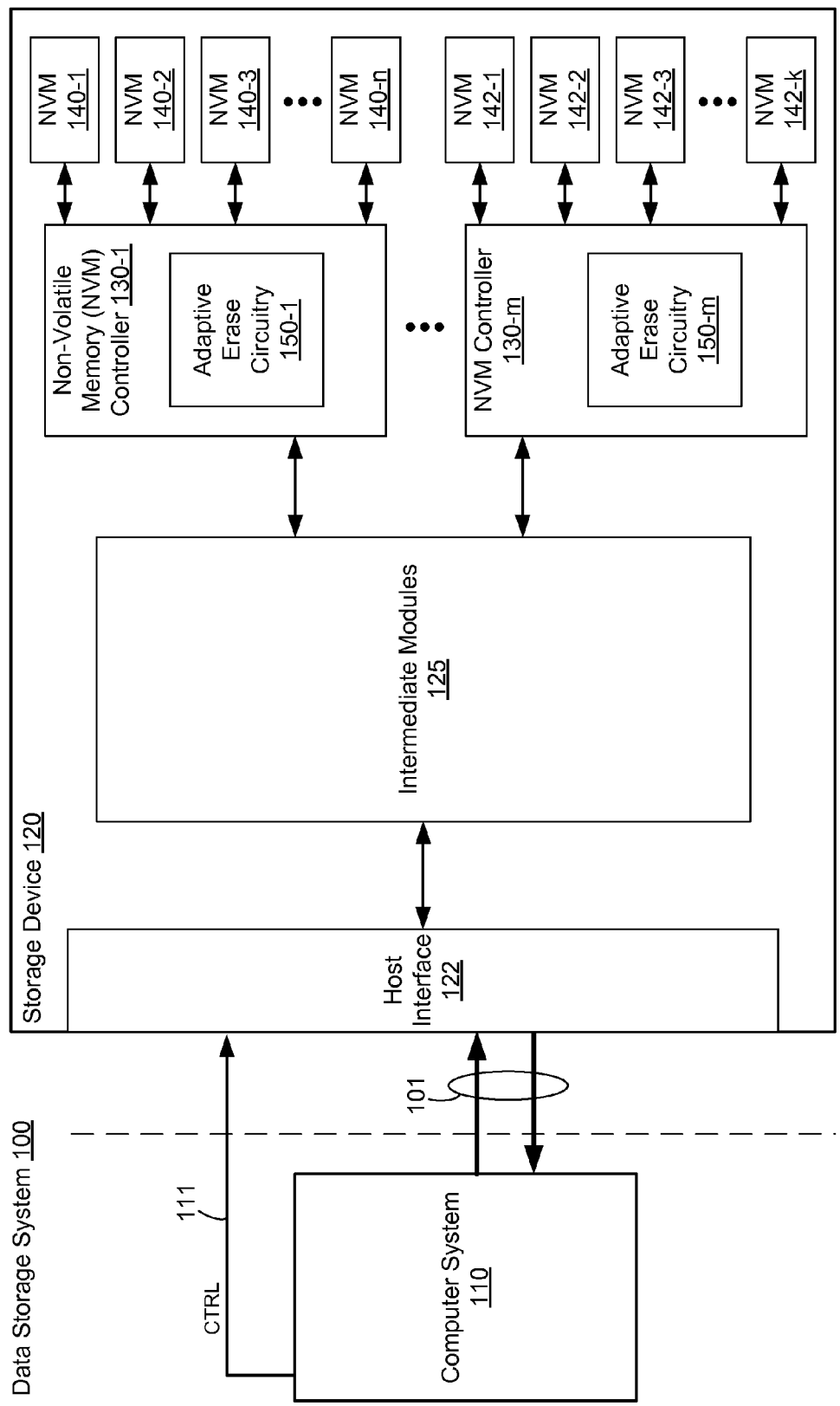
FIG. 1A is a block diagram illustrating an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to enable adaptive erasure in memory devices. Some implementations include systems, methods and/or devices to perform an adaptive erase operation to preserve memory life. In some embodiments, the systems, methods, and/or devices perform the adaptive erase operation to maintain a consistent latency associated with erase operations.

More specifically, some implementations include a method of adaptively erasing data in a storage device. In some implementations, the storage device comprises one or more non-volatile memory devices. In some implementations, the method includes performing a plurality of memory operations including read operations and respective erase operations on portions of the one or more non-volatile memory devices specified by the read operations and respective erase operations. The respective erase operations are performed using a first set of erase parameters that has been established as a current set of erase parameters prior to performing the respective erase operations. The method also includes, in accordance with each erase operation of at least a subset of the respective erase operations, updating one or more erase statistics that correspond to performance of multiple erase operations. The method further includes, in accordance with a comparison of the erase statistics with an erasure performance threshold, establishing a second set of erase parameters as the current set of erase parameters.

In some embodiments, the one or more erase statistics include erase operation duration statistics with respect to durations for the multiple erase operations.

In some embodiments, the method further includes, for each erase operation of the respective erase operations, updating the one or more erase statistics.

In some embodiments, updating the one or more erase statistics that correspond to the performance of the multiple erase operations includes updating at least one of the one or more erase statistics in accordance with how many erase operations, of the multiple erase operations, have durations that exceed a predefined duration threshold.

In some embodiments, updating the one or more erase statistics that correspond to the performance of the multiple erase operations includes identifying erase operations, of the multiple erase operations, whose durations exceed a predefined duration threshold, and updating at least one of the one or more erase statistics in accordance with the identified erase operations.

In some embodiments, the first set of erase parameters includes an initial pulse voltage and an incremental pulse voltage.

In some embodiments, the method includes, in accordance with a determination that one or more erase statistics corresponds to a rate or count of successful erase operations that equals or exceeds an erasure success threshold, establishing the second set of erase parameters as the current set of erase parameters by decreasing one or both of: an initial pulse voltage and an incremental pulse voltage of the current set of erase parameters. In some embodiments, successful erase operations include erase operations having erase durations less than a first duration threshold.

In some embodiments, the method includes, in accordance with a determination that one or more erase statistics corresponds to a rate or count of unsuccessful erase operations that equals or exceeds an erasure failure threshold, establishing the second set of erase parameters as the current set of erase parameters by increasing one or both of: an initial pulse voltage and an incremental pulse voltage of the current set of erase parameters. In some embodiments, unsuccessful erase operations include erase operations having erase durations greater than a second duration threshold.

In some embodiments, each erase operation of the respective erase operations includes applying a first voltage pulse to one or more portions of the one or more non-volatile memory devices in accordance with the current set of erase parameters, and in accordance with a determination that the one or more portions of the one or more non-volatile memory devices have not been successfully erased, applying one or more subsequent voltage pulses in accordance with the current set of erase parameters until predefined criteria have been met. The predefined criteria includes that the one or more portions of the one or more non-volatile memory devices have been successfully erased.

In some embodiments, each erase operation of the respective erase operations includes applying a set of voltage pulses to one or more portions of the one or more non-volatile memory devices in accordance with the current set of erase parameters, and in accordance with a determination that the one or more portions of the one or more non-volatile memory devices have not been successfully erased, applying one or more subsequent sets of voltage pulses to the one or more portions of the one or more non-volatile memory devices until second predefined criteria have been met. The second predefined criteria includes that the one or more portions of the one or more non-volatile memory devices have been successfully erased.

In some embodiments, the method further includes receiving one or more host read commands to read data from one or more memory blocks on the storage device, and prior to applying the one or more subsequent sets of voltage pulses to the one or more portions of the one or more non-volatile memory devices, processing at least a subset of the one or more host read commands to read data from the one or more memory blocks on the storage device.

In some embodiments, the method further includes identifying one or more portions of the one or more non-volatile memory devices that fail to satisfy a predefined erasure performance requirement when one or more erase operations are performed using the first set of erase parameters. In some embodiments, the method includes, subsequent to identifying the one or more portions of the one or more non-volatile memory devices, forgoing erase operations on the one or more portions of the one or more non-volatile memory devices using the first set of erase parameters. In some embodiments, the method includes, subsequent to establishing the second set of erase parameters as the current set of erase parameters, performing an erase operation on at least a subset of the identified one or more portions of the one or more non-volatile memory devices using the second set of erase parameters.

In some embodiments, the method is performed by a non-volatile memory controller of the storage device and the one or more erase statistics correspond to performance of multiple erase operations on portions of one or more non-volatile memory devices coupled to the non-volatile memory controller.

In some embodiments, the storage device includes a plurality of non-volatile memory controllers, each coupled to a distinct set of one or more non-volatile memory devices in the storage device, and the method is performed independently by each non-volatile memory controller of the plurality of non-volatile memory controllers of the storage device.

In some embodiments, the one or more non-volatile memory devices include one or more flash memory devices.

In some embodiments, multiple sets of erase parameters, including the first set of erase parameters and the second set of erase parameters, are stored in non-volatile memory of the storage device.

In some embodiments, the storage device includes a dual in-line memory module (DIMM) device.

In some embodiments, a plurality of controllers on the storage device include at least one non-volatile memory controller and at least one other memory controller other than the at least one non-volatile memory controller.

In some embodiments, one of the plurality of controllers on the storage device maps double data rate (DDR) interface commands to serial advance technology attachment (SATA) interface commands.

In another aspect, any of the methods described above are performed by a storage device including (1) an interface for coupling the storage device to a host system, (2) one or more controllers, each of the one or more controllers configured to: (A) perform a plurality of memory operations including read operations and respective erase operations on portions of the one or more non-volatile memory devices specified by the read operations and respective erase operations, where the respective erase operations are performed using a first set of erase parameters that has been established as a current set of erase parameters prior to performing the respective erase operations, (B) in accordance with each erase operation of at least a subset of the respective erase operations, update one or more erase statistics that correspond to performance of multiple erase operations, and (C) in accordance with a comparison of the erase statistics with an erasure performance threshold, establish a second set of erase parameters as the current set of erase parameters.

In some embodiments, the storage device is configured to perform any of the methods described above.

In yet another aspect, any of the methods described above are performed by a storage device. In some embodiments, the device includes (A) a storage controller, including (1) means for performing a plurality of memory operations including read operations and respective erase operations on portions of the one or more non-volatile memory devices specified by the read operations and respective erase operations, where the respective erase operations are performed using a first set of erase parameters that has been established as a current set of erase parameters prior to performing the respective erase operations; (2) means, enabled in accordance with each erase operation of at least a subset of the respective erase operations, for updating one or more erase statistics that correspond to performance of multiple erase operations; and (3) means, enabled in accordance with a comparison of the erase statistics with an erasure performance threshold, for establishing a second set of erase parameters as the current set of erase parameters.

In yet another aspect, a non-transitory computer readable storage medium, stores one or more programs for execution by one or more processors of a storage device having one or more controllers, the one or more programs including instructions for performing any of the methods described above.

In some embodiments, the non-transitory computer readable storage medium includes a non-transitory computer readable storage medium for each controller of a plurality of controllers of the storage device, each having the one or more programs including instructions for performing any of the methods described above.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1A is a block diagram illustrating an implementation of a data storage system 100, in accordance with some embodiments. While some example features are illustrated, various other features have not been illustrated for the sake of brevity and so as not to obscure more pertinent aspects of the example implementations disclosed herein. To that end, as a non-limiting example, data storage system 100 includes storage device 120, which includes host interface 122, intermediate modules 125, one or more non-volatile memory controllers (e.g., non-volatile memory controller(s) 130), and non-volatile memory (e.g., one or more non-volatile memory device(s) 140, 142), and is used in conjunction with computer system 110. In some implementations, storage device 120 includes a single non-volatile memory device while in other implementations storage device 120 includes a plurality of non-volatile memory devices. In some implementations, non-volatile memory devices 140, 142 include NAND-type flash memory or NOR-type flash memory. Further, in some implementations, non-volatile memory controller 130 is a solid-state drive (SSD) controller. However, one or more other types of storage media may be included in accordance with aspects of a wide variety of implementations.

Computer system 110 is coupled to storage device 120 through data connections 101. However, in some implementations computer system 110 includes storage device 120 as a component and/or sub-system. Computer system 110 may be any suitable computer device, such as a personal computer, a workstation, a computer server, or any other computing device. Computer system 110 is sometimes called a host or host system. In some implementations, computer system 110 includes one or more processors, one or more types of memory, optionally includes a display and/or other user interface components such as a keyboard, a touch screen display, a mouse, a track-pad, a digital camera and/or any number of supplemental devices to add functionality. Further, in some implementations, computer system 110 sends one or more host commands (e.g., read commands and/or write commands) on control line 111 to storage device 120. In some implementations, computer system 110 is a server system, such as a server system in a data center, and does not have a display and other user interface components.

In some implementations, storage device 120 includes non-volatile memory devices 140, 142 (e.g., non-volatile memory devices 140-1 through 140-$n$ and non-volatile memory devices 142-1 through 142-$k$) and non-volatile memory controllers 130 (e.g., non-volatile memory controllers 130-1 through 130-$m$). In some implementations, each non-volatile memory controller of non-volatile memory controllers 130 include one or more processing units (also sometimes called CPUs or processors or microprocessors or microcontrollers) configured to execute instructions in one or more programs (e.g., in non-volatile memory controllers 130). In some implementations, the one or more processors are shared by one or more components within, and in some cases, beyond the function of non-volatile memory controllers 130. In some implementations, each non-volatile memory controller of non-volatile memory controllers 130 includes adaptive erase circuitry 150. Non-volatile memory devices 140, 142 are coupled to non-volatile memory controllers 130 through connections that typically convey commands in addition to data, and optionally convey metadata, error correction information and/or other information in addition to data values to be stored in non-volatile memory devices 140, 142 and data values read from non-volatile memory devices 140, 142. For example, non-volatile memory devices 140, 142 can be configured for enterprise storage suitable for applications such as cloud computing, or for caching data stored (or to be stored) in secondary storage, such as hard disk drives. Additionally and/or alternatively, flash memory can also be configured for relatively smaller-scale applications such as personal flash drives or hard-disk replacements for personal, laptop and tablet computers. Although flash memory devices and flash controllers are used as an example here, storage device 120 may include any other non-volatile memory device(s) and corresponding non-volatile memory controller(s).

In some implementations, intermediate modules 125 include one or more processing units (also sometimes called CPUs or processors or microprocessors or microcontrollers) configured to execute instructions in one or more programs. Intermediate modules 125 are coupled to host interface 122, and non-volatile memory controllers 130 in order to coordinate operations performed by these components, for example supervising and controlling functions such as power up, power down, data hardening, charging energy storage device(s), data logging, communicating between modules on the storage device and other aspects of managing functions on storage device 120.

Figure 1B:
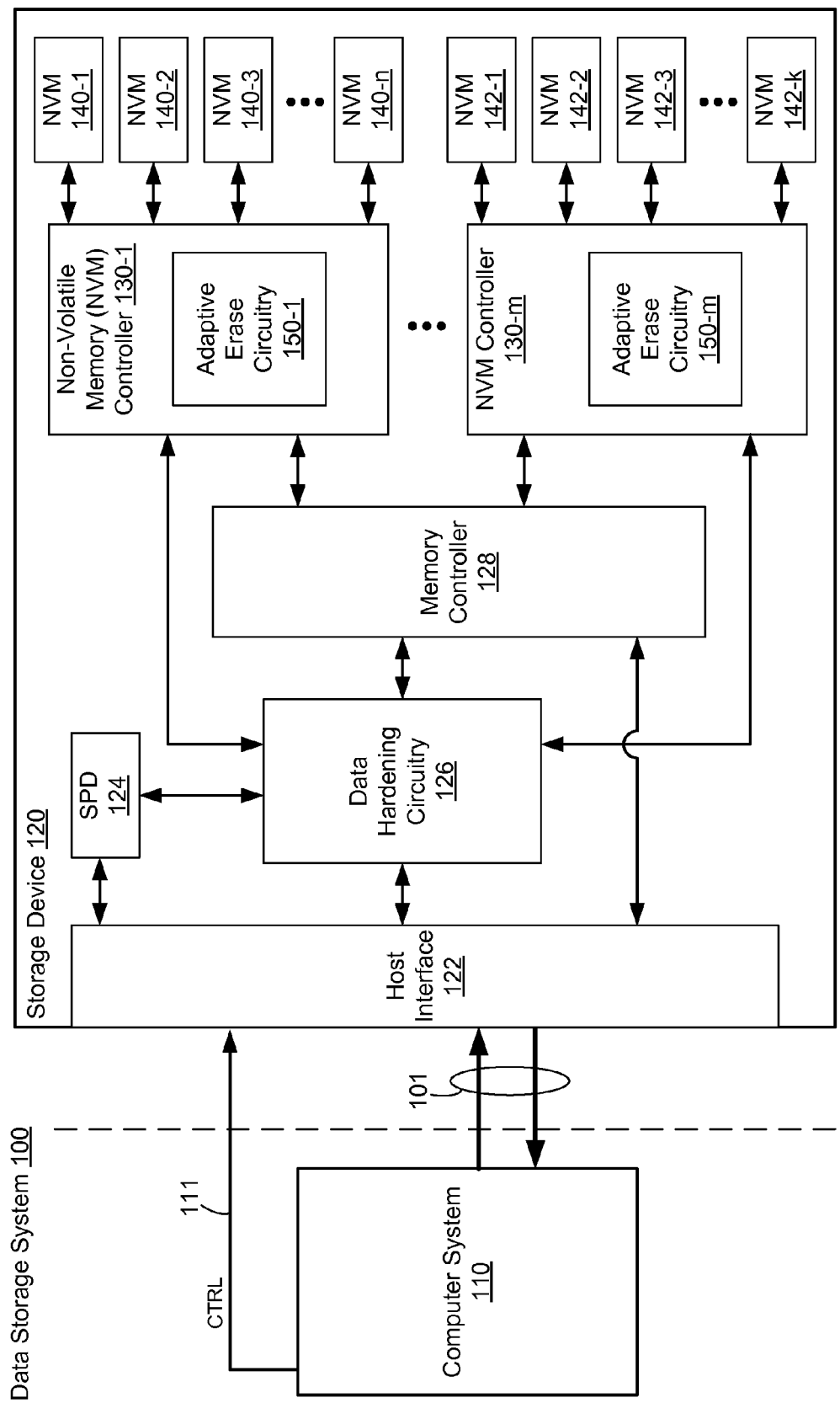
FIG. 1B is a block diagram illustrating an implementation of a data storage system, in accordance with some embodiments.

FIG. 1B is a block diagram illustrating an implementation of a data storage system 100, in accordance with some embodiments. While some exemplary features are illustrated, various other features have not been illustrated for the sake of brevity and so as not to obscure more pertinent aspects of the example implementations disclosed herein. To that end, as a non-limiting example, data storage system 100 includes storage device 120, which includes host interface 122, serial presence detect (SPD) device 124, data hardening circuitry 126, memory controller 128, one or more non-volatile memory controllers (e.g., non-volatile memory controller(s) 130), and non-volatile memory (e.g., one or more non-volatile memory device(s) 140, 142), and is used in conjunction with computer system 110. Storage device 120 may include various additional features that have not been illustrated for the sake of brevity and so as not to obscure more pertinent features of the example implementations disclosed herein, and a different arrangement of features may be possible. Host interface 122 provides an interface to computer system 110 through data connections 101.

In some implementations, data hardening circuitry 126 is used to transfer data from volatile memory to non-volatile memory during a power failure condition, and includes one or more processing units (also sometimes called CPUs or processors or microprocessors or microcontrollers) configured to execute instructions in one or more programs (e.g., in data hardening circuitry 126). In some implementations, the one or more processors are shared by one or more components within, and in some cases, beyond the function of data hardening circuitry 126. Data hardening circuitry 126 is coupled to host interface 122, SPD device 124, memory controller 128, and non-volatile memory controllers 130 in order to coordinate the operation of these components, including supervising and controlling functions such as power up, power down, data hardening, charging energy storage device(s), data logging, and other aspects of managing functions on storage device 120.

Memory controller 128 is coupled to host interface 122, data hardening circuitry 126, and non-volatile memory controllers 130. In some implementations, during a write operation, memory controller 128 receives data from computer system 110 through host interface 122 and during a read operation, memory controller 128 sends data to computer system 110 through host interface 122. Further, host interface 122 provides additional data, signals, voltages, and/or other information needed for communication between memory controller 128 and computer system 110. In some embodiments, memory controller 128 and host interface 122 use a defined interface standard for communication, such as double data rate type three synchronous dynamic random access memory (DDR3). In some embodiments, memory controller 128 and non-volatile memory controllers 130 use a defined interface standard for communication, such as serial advance technology attachment (SATA). In some other implementations, the device interface used by memory controller 128 to communicate with non-volatile memory controllers 130 is SAS (serial attached SCSI), or other storage interface. In some implementations, memory controller 128 includes one or more processing units (also sometimes called CPUs or processors or microprocessors or microcontrollers) configured to execute instructions in one or more programs (e.g., in memory controller 128). In some implementations, the one or more processors are shared by one or more components within, and in some cases, beyond the function of memory controller 128.

SPD device 124 is coupled to host interface 122 and data hardening circuitry 126. Serial presence detect (SPD) refers to a standardized way to automatically access information about a computer memory module (e.g., storage device 120). For example, if the memory module has a failure, the failure can be communicated with a host system (e.g., computer system 110) through SPD device 124.

Figure 2:
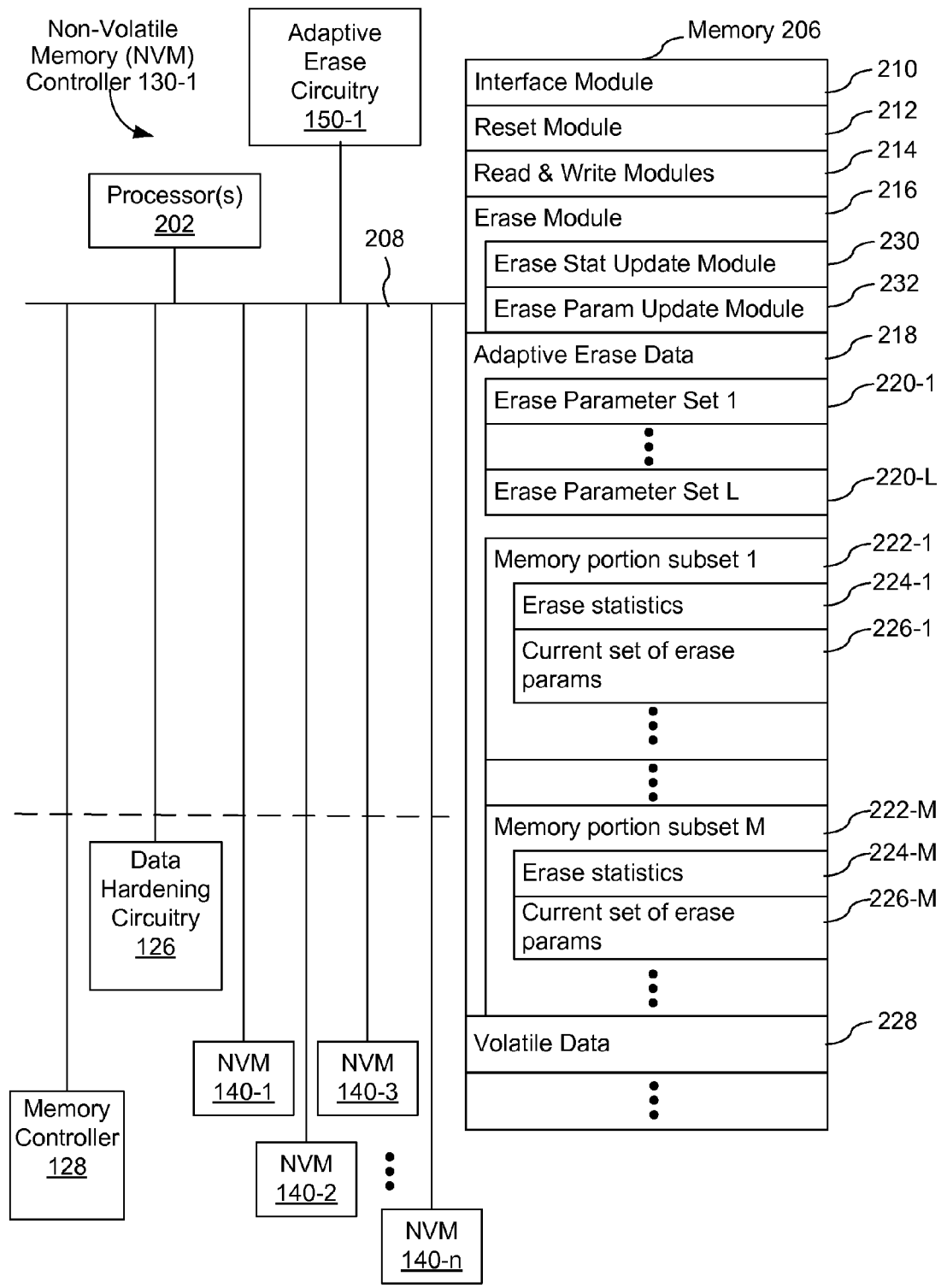
FIG. 2 is a block diagram illustrating an implementation of a non-volatile memory controller, in accordance with some embodiments.
Figure 3A:
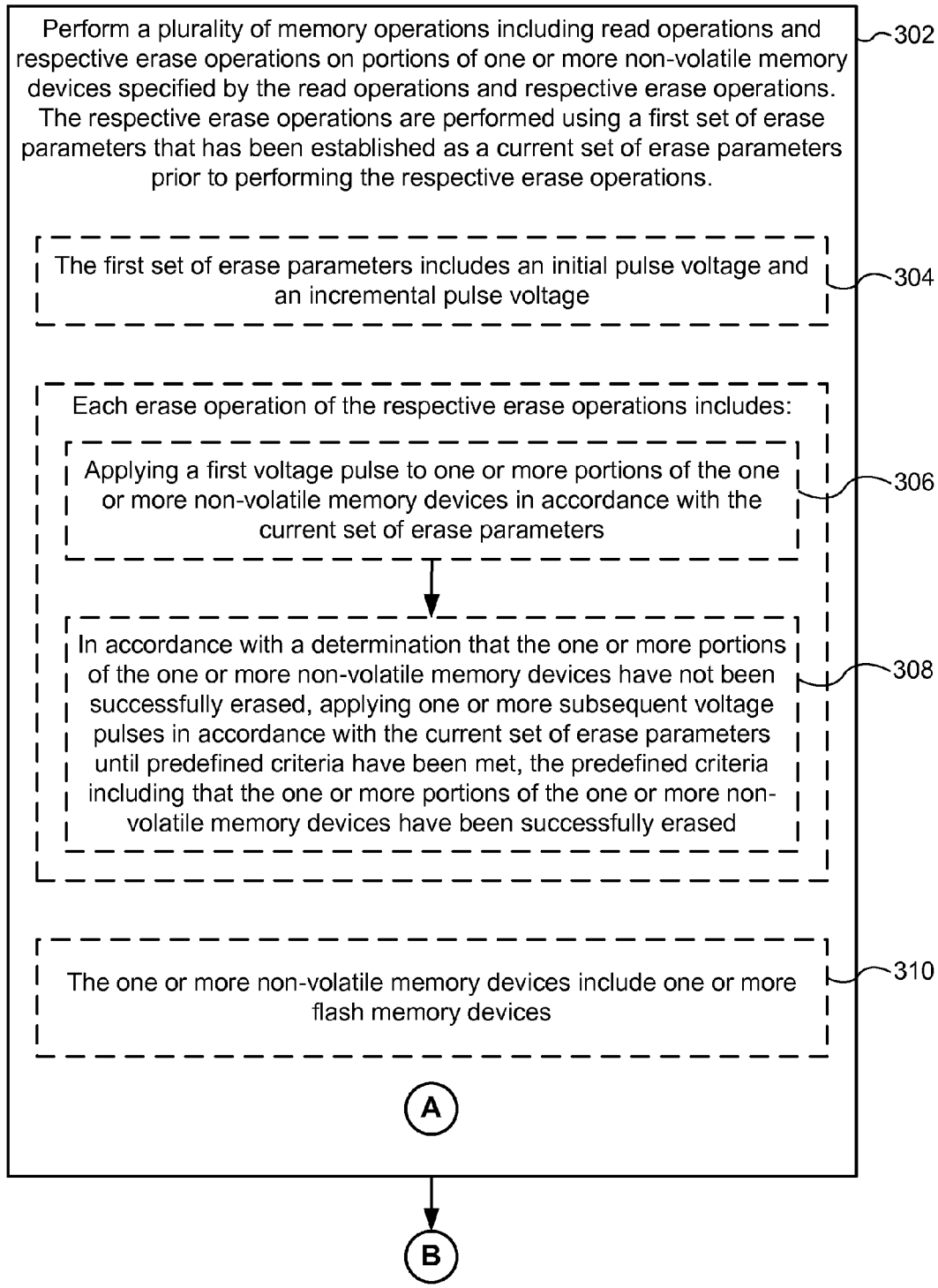
FIGS. 3A-3F illustrate a flowchart representation of a method of adaptively erasing data in a storage device, in accordance with some embodiments.
Figure 3B:
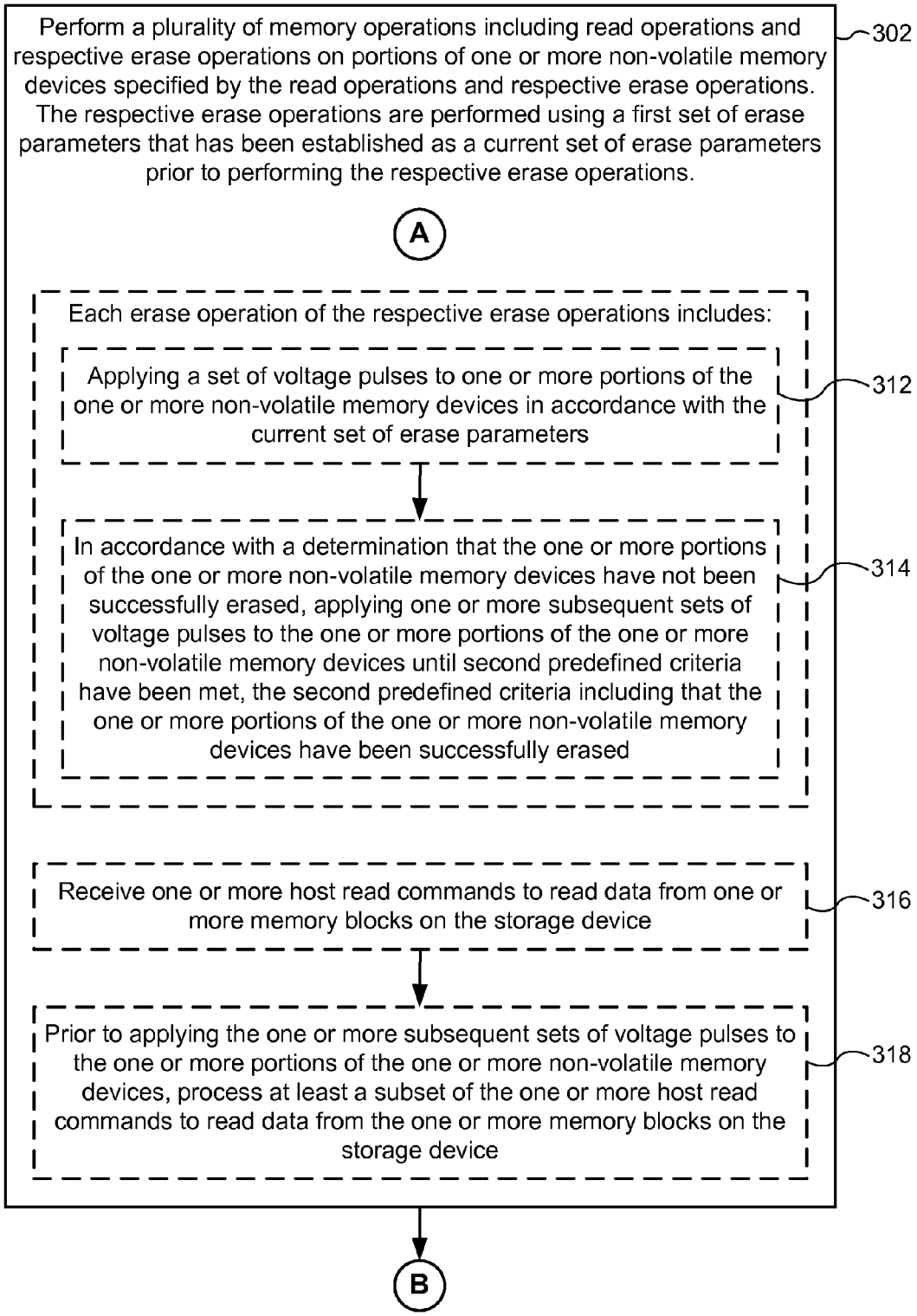
Figure 3C:
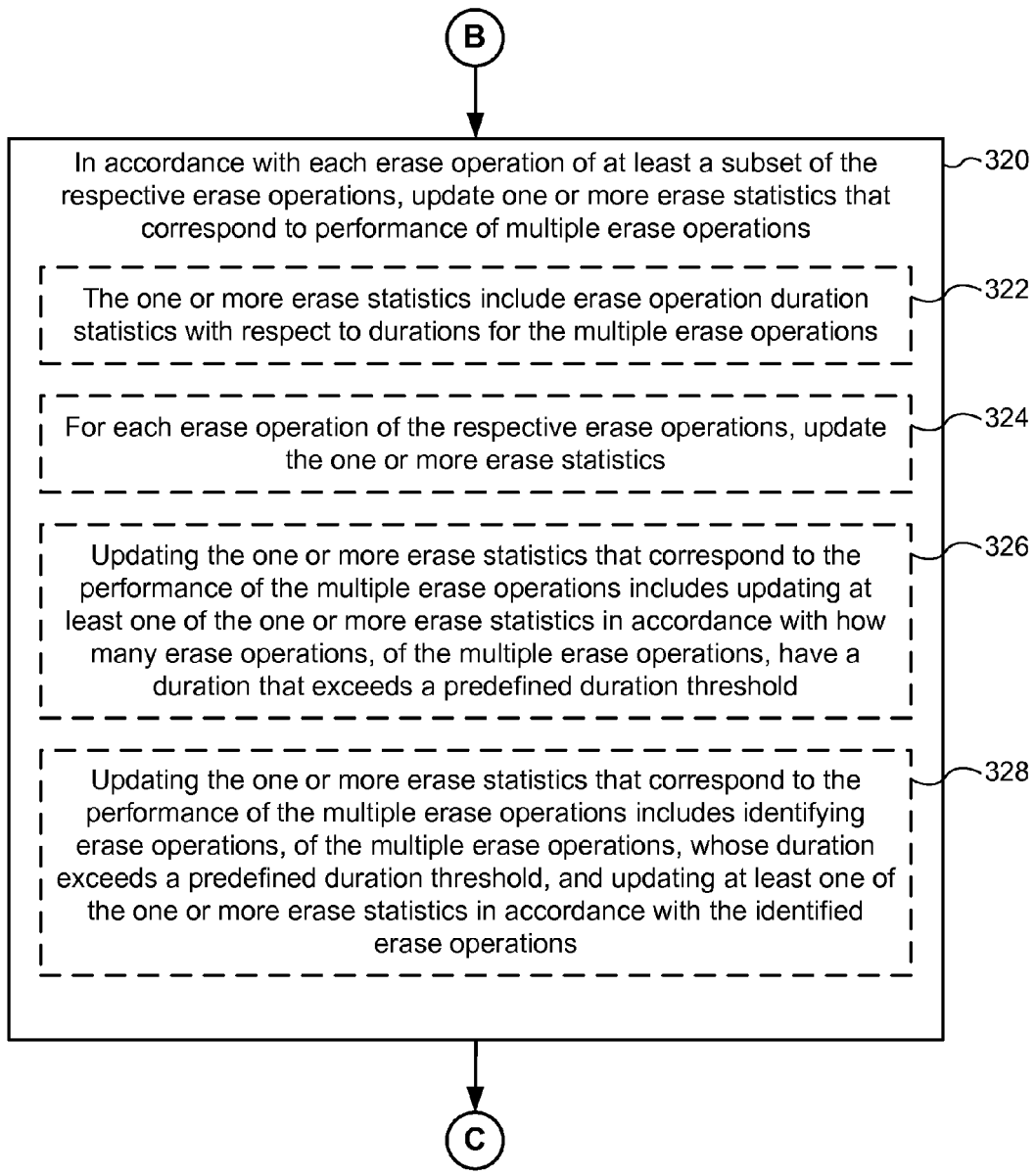
Figure 3D:
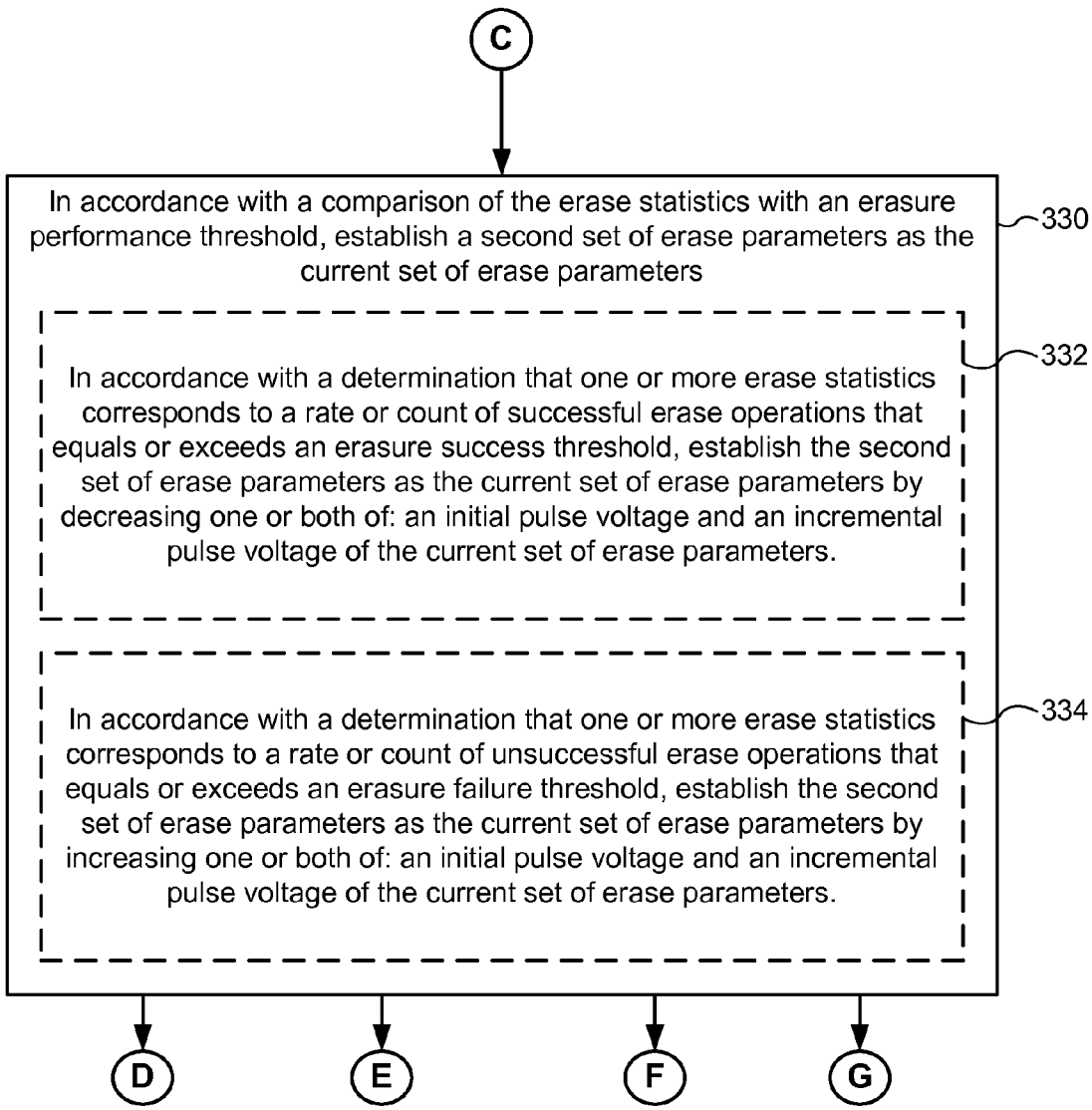
Figure 3E:
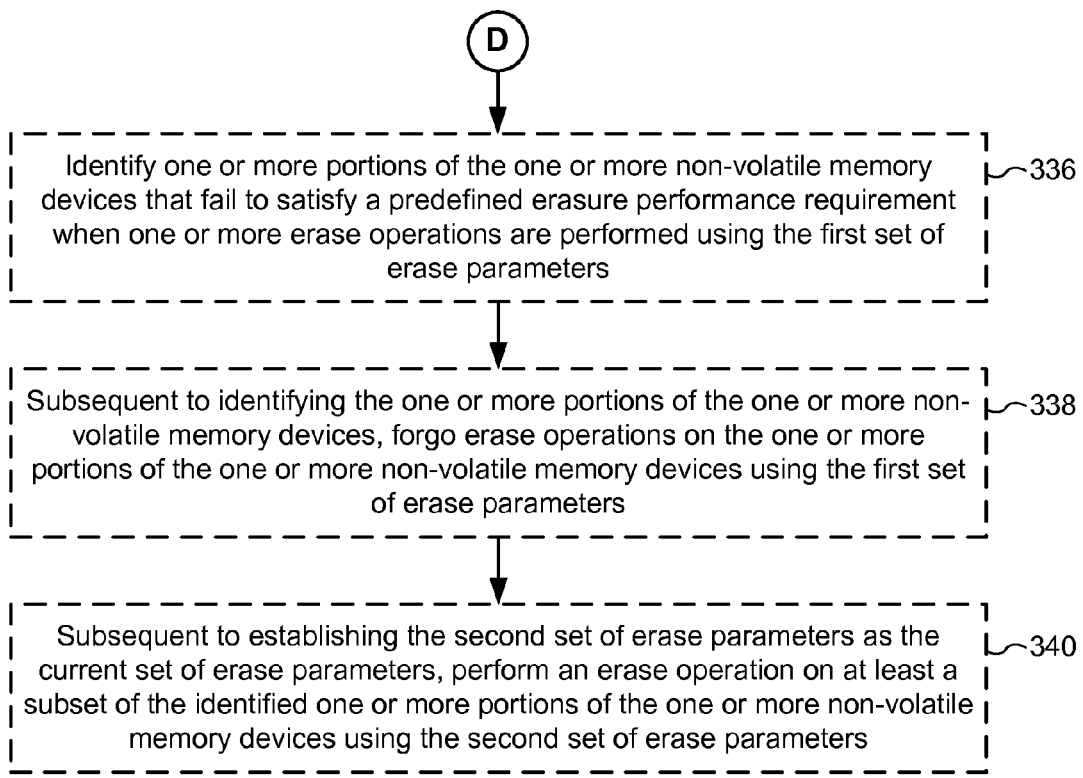
Figure 3F:
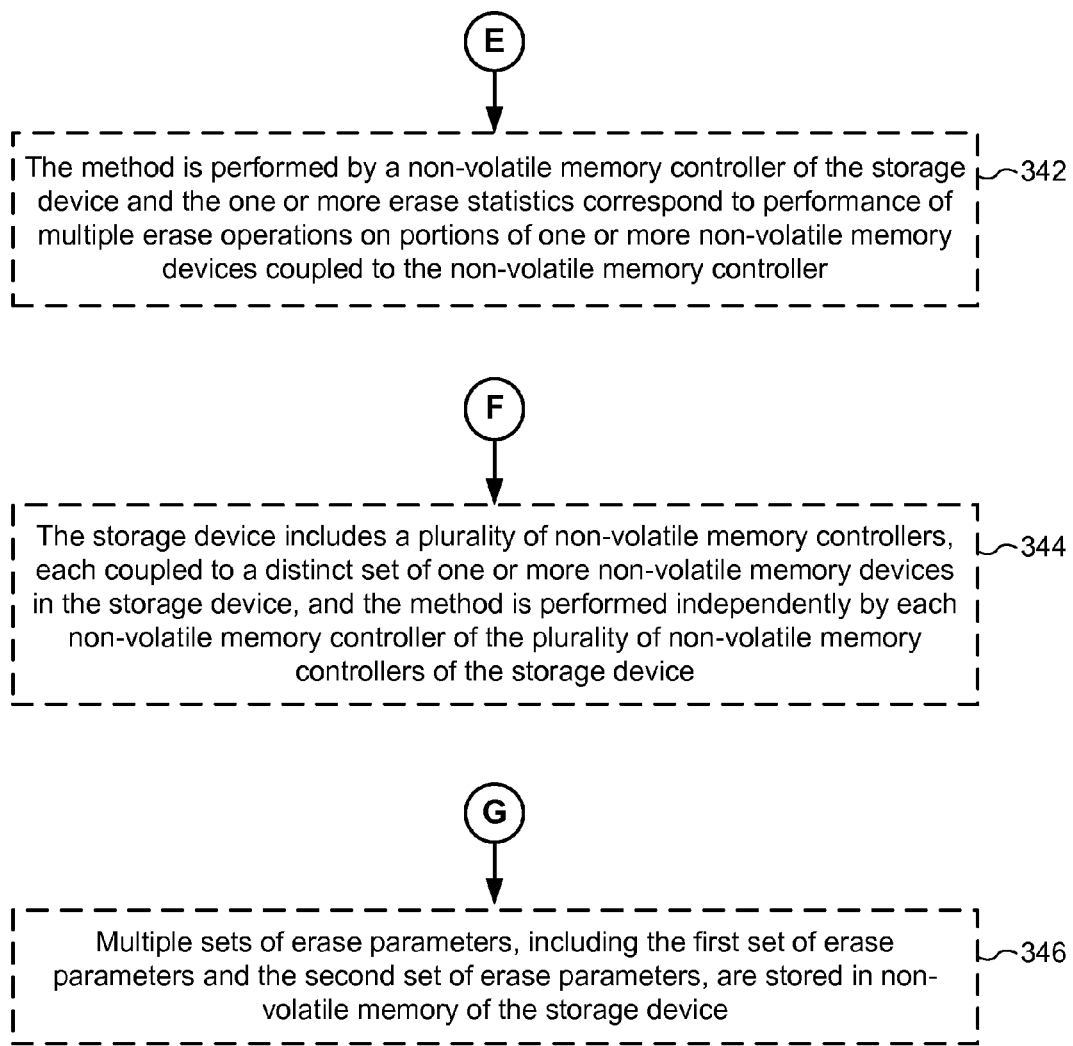

FIG. 2 is a block diagram illustrating an implementation of a non-volatile memory controller 130-1, in accordance with some embodiments. Non-volatile memory controller 130-1 typically includes one or more processors (also sometimes called CPUs or processing units or microprocessors or microcontrollers) 202 for executing modules, programs and/or instructions stored in memory 206 and thereby performing processing operations, memory 206, and one or more communication buses 208 for interconnecting these components. Communication buses 208 optionally include circuitry (sometimes called a chipset) that interconnects and controls communications between system components. In some implementations, non-volatile memory controller 130-1 also includes adaptive erase circuitry 150-1. In some embodiments, adaptive erase circuitry 150-1 performs erase operations based on one or more sets of erase parameters (e.g., current set of erase parameters 226). In some embodiments, non-volatile memory controller 130-1 is coupled to memory controller 128, data hardening circuitry 126 (if present), and non-volatile memory devices 140 (e.g., non-volatile memory devices 140-1 through 140-n) by communication buses 208. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from processor(s) 202. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset thereof:

- an interface module 210 that is used for communicating with other components, such as memory controller 128, data hardening circuitry 126, and non-volatile memory devices 140;
- a reset module 212 that is used for resetting non-volatile memory controller 130-1;
- one or more read and write modules 214 used for reading from and writing to non-volatile memory devices 140;
- an erase module 216 that is used for erasing portions of memory on non-volatile memory devices 140;
- adaptive erase data 218 that is used for performing adaptive erase operations on non-volatile memory devices 140; and
- volatile data 228 including volatile data associated with non-volatile memory controller 130-1.

In some embodiments, the erase module 216 includes an erase statistics update module 230 that includes instructions for updating one or more erase statistics 224 (described below) based on erase operations, and/or an erase parameter update module 232 that includes instructions for conditionally modifying one or more current sets of erase parameters 226.

In some embodiments, the adaptive erase data 218 includes erase parameter sets 220-1 to 220-L. In some embodiments, each erase parameter set includes an initial pulse voltage and an incremental pulse voltage (e.g., an initial pulse voltage of 1.8 V, and an incremental pulse voltage of 0.1 V). In some embodiments, the sets of erase parameters are on a scale of increasing initial pulse voltage (e.g., the initial pulse voltage of erase parameter set 1 is less than the initial pulse voltage of erase parameter set L). In some embodiments, one or both of the initial pulse voltage and the incremental pulse voltage increase from one erase parameter set to a subsequent erase parameter set (e.g., an initial pulse voltage of a first set of erase parameters is less than an initial pulse voltage of a second set of erase parameters, and/or an incremental pulse voltage of the first set of erase parameters is less than an incremental pulse voltage of the second set of erase parameters). In some embodiments, the erase parameter set includes more than one incremental pulse voltage (e.g., a first incremental pulse voltage of 0.1 V for the first five erase pulses, then a second incremental pulse voltage of 0.2 V for all remaining erase pulses).

In some embodiments, the adaptive erase data 218 includes memory portion data subsets 222-1 to 222-M. These memory portion data subsets 222 store adaptive erase information pertaining to distinct memory portions of non-volatile memory devices 140. In some embodiments, one memory portion data subset (e.g., subset 222-1) corresponds to one non-volatile memory device (e.g., non-volatile memory device 140-1). In some embodiments, one memory portion of non-volatile memory devices 140, corresponds to a subset of memory on a non-volatile memory device (e.g., non-volatile memory device 140-1). In some embodiments, one or more of non-volatile memory devices 140, respectively comprise a single integrated circuit die (i.e., chip or microchip). In some embodiments, one or more of non-volatile memory devices 140 respectively include a plurality of integrated circuit dies.

In some embodiments, the memory portion subsets 222 include data elements pertaining to erase statistics 224 and the current set of erase parameters 226 for the respective memory portion. For example, memory portion data subset 222-1 includes erase statistics 224-1 for the first memory portion, and information regarding the current set of erase parameters 226-1 being applied in an adaptive erase function to the first memory portion. As erase operations are performed on the respective memory portions, the corresponding erase statistics are updated. In some embodiments, the erase statistics 224 include information regarding the proportion of the corresponding memory portions that have successfully or unsuccessfully been erased. For example, if erase operations are performed on the first memory portion using the current set of erase parameters 226-1, and 90% of the erase operations are successful (e.g., meet predefined success criteria), the erase statistics 224-1 would be updated to reflect this information. In some embodiments, erase operations are considered to be successful if the erase operations are completed within a predefined amount of time or within a predefined number of erase pulses. Thus, in such embodiments, if an erase operation does result in erasure of the memory portion (e.g., one or more blocks), but takes longer than the predefined amount of time, the erase operation would be considered to be unsuccessful for purposes of at least one of the erase statistics. In some embodiments, the erase statistics are used to make a comparison to an erasure performance threshold (e.g., proportion of erase success, average duration of time to erase, etc.), for determining if the current set of erase parameters needs to be updated. Alternatively, the erase statistics 224 include information regarding a number of memory units (e.g., blocks, etc.) that have successfully or unsuccessfully been erased.

In some embodiments, the current set of erase parameters 226 for each memory portion data subset 222 includes a reference to one of the set of erase parameters 220-1 to 220-L. In some embodiments, the current set of erase parameters 226 for each memory portion data subset 222, includes a copy of the parameter values of one of the sets of erase parameters 220-1 to 220-L.

In some embodiments, memory portion data subsets 222 may store a subset of the data structures identified above. Furthermore, memory portion data subsets 222 may store additional data structures not described above.

In some embodiments, the adaptive erase data 218 may include a subset of the data structures identified above. Furthermore, the adaptive erase data 218 may store additional modules and data structures not described above.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing respective operations in the methods described below with reference to FIGS. 3A-3F.

Although FIG. 2 shows a non-volatile memory controller 130-1, FIG. 2 is intended more as a functional description of the various features which may be present in a non-volatile memory controller than as a structural schematic of the embodiments described herein. In practice, and as recognized by those of ordinary skill in the art, items shown separately could be combined and some items could be separated. Further, although FIG. 2 shows a non-volatile memory controller 130-1, the description of FIG. 2 similarly applies to other non-volatile memory controllers (e.g., non-volatile memory controllers 130-2 through 130-m) in storage device 120 (FIG. 1).

FIGS. 3A-3F illustrate a flowchart representation of a method 300 of adaptively erasing data in a storage device, in accordance with some embodiments. In some embodiments, the storage device includes one or more non-volatile memory devices. The method includes, performing (302) a plurality of memory operations including read operations and respective erase operations on portions of the one or more non-volatile memory devices specified by the read operations and respective erase operations. The respective erase operations are performed using a first set of erase parameters that has been established as a current set of erase parameters prior to performing the respective erase operations. In some embodiments, at least one portion of the portions of one or more non-volatile memory devices corresponds to the non-volatile memory of one or more integrated circuit die. In some embodiments, at least one portion of the portions of one or more non-volatile memory devices is smaller than the non-volatile memory of an integrated circuit die. In some embodiments, the portions of the one or more non-volatile memory devices are configured to store host data (e.g., user data corresponding to files, documents photos), as well as metadata. In some embodiments, the portions of the one or more non-volatile memory devices store the host data and the metadata.

In some embodiments, the first set of erase parameters includes (304) an initial pulse voltage and an incremental pulse voltage. For example, the first set of erase parameters may include an initial pulse voltage of 1.8 V and an incremental pulse voltage of 0.1 V. The exemplary initial pulse voltage of 1.8 V and an incremental pulse voltage of 0.1 V correspond to application of an initial erase pulse of 1.8 V, a subsequent voltage pulse of 1.9 V, a subsequent voltage pulse of 2.0 V, etc. to one or more portions of non-volatile memory. In some embodiments, the sets of erase parameters include sequentially increasing initial pulse voltages (e.g., a first set has a 1.8 V initial pulse voltage and a second set has a 1.9 V initial pulse voltage, etc.). In some embodiments, the sets of erase parameters include sequentially increasing incremental pulse voltages (e.g., a first set has 0.1 V incremental pulse voltage, and a second set has 0.2 V incremental pulse voltage, etc.). In some embodiments, one or both of the initial pulse voltage and the incremental pulse voltage increase from one set of erase parameters to a subsequent set of erase parameters. In some embodiments, the set of erase parameters includes more than one incremental pulse voltage (e.g., a first incremental pulse voltage of 0.1 V for first five pulses, then a second incremental pulse voltage of 0.2 V for all of the remaining pulses). In some embodiments, any and all sets of erase parameters have an initial pulse voltage and one or more incremental pulse voltages. In some embodiments, the incremental pulse voltage is 0 V.

In some embodiments, each erase operation of the respective erase operations includes, applying (306) a first voltage pulse to one or more portions of the one or more non-volatile memory devices in accordance with the current set of erase parameters (e.g., a first voltage pulse of 1.8 V); and, in accordance with a determination that the one or more portions of the one or more non-volatile memory devices have not been successfully erased, applying (308) one or more subsequent voltage pulses in accordance with the current set of erase parameters until predefined criteria have been met. The predefined criteria includes that the one or more portions of the one or more non-volatile memory devices have been successfully erased. For example, after applying an initial pulse voltage of 1.8 V to one or more portions of the one or more non-volatile memory devices, in accordance with a determination that the one or more portions of the one or more non-volatile memory devices have not been successfully erased, five subsequent voltage pulses may applied to the one or more portions of the one or more non-volatile memory devices before the one or more portions of the one or more non-volatile memory devices are determined to be successfully erased.

In some embodiments, the one or more non-volatile memory devices include (310) one or more flash memory devices.

In some embodiments, each erase operation of the respective erase operations includes, applying (312, FIG. 3B) a set of voltage pulses to one or more portions of the one or more non-volatile memory devices in accordance with the current set of erase parameters; and, in accordance with a determination that the one or more portions of the one or more non-volatile memory devices have not been successfully erased, applying (314) one or more subsequent sets of voltage pulses to the one or more portions of the one or more non-volatile memory devices until second predefined criteria have been met. The second predefined criteria includes that the one or more portions of the one or more non-volatile memory devices have been successfully erased. Optionally, the second predefined criteria include a maximum number of sets of voltage pulses to erase the one or more portions of the one or more non-volatile memory devices. Thus, optionally, the second predefined criteria are satisfied when the maximum number of sets of voltage pulses have been applied, regardless of whether the one or more portions of the one or more non-volatile memory devices have been successfully erased. In some embodiments, the one or more subsequent sets of voltage pulses are applied in accordance with the current set of erase parameters.

In some embodiments, the method further includes, receiving (316) one or more host read commands to read data from one or more memory blocks on the storage device; and, prior to applying the one or more subsequent sets of voltage pulses to the one or more portions of the one or more non-volatile memory devices, processing (318) at least a subset of the one or more host read commands to read data from the one or more memory blocks on the storage device. For example, host read commands are sent to a controller for reading data from one or more non-volatile memory devices. In this example, an erase operation is being performed by the controller on a first non-volatile memory device while one or more of the host read commands request reading data from the same first non-volatile memory device. In this example, after applying a first set of voltage pulses (e.g., ten voltage pulses) to the first non-volatile memory device, that device has not been successfully erased. In this example, one or more of the host read commands are processed before a second set of voltage pulses is applied to the first non-volatile memory device, to try to erase the device again. In a further example, all host read commands pending (e.g., already received) at the conclusion of applying the first set of voltage pulses are processed before a second set of voltage pulses is applied to the first non-volatile memory device. In some embodiments, receiving the one or more host read commands to read data from one or more memory blocks on the storage device includes receiving the one or more host read commands while performing one or more erase operations of the respective erase operations.

The method further includes, in accordance with each erase operation of at least a subset of the respective erase operations, updating (320, FIG. 3C) one or more erase statistics that correspond to performance of multiple erase operations. In some embodiments, as erase operations are performed on one or more portions of the one or more non-volatile memory devices, erase statistics that correspond to the one or more portions of the one or more non-volatile memory devices are updated. In some embodiments, the erase statistics include information regarding a fraction of the one or more portions of the one or more non-volatile memory devices (or a number of memory units, such as blocks, within each portion of the one or more portions of the one or more non-volatile memory devices) that have successfully or unsuccessfully been erased. For example, when an adaptive erase operation was performed on a first memory portion using a current set of erase parameters, and resulted in 90% of the first memory portion (or a number of memory units that correspond to 90% of memory units in the first memory portion) being successfully erased, the erase statistics would be updated to reflect this information. In some embodiments, the updated erase statistics include a reference to the set of erase parameters used during a last erase operation on the first memory portion.

In some embodiments, the one or more erase statistics include (322) erase operation duration statistics with respect to durations for the multiple erase operations. For example, when an erase operation required seven voltage pulses to successfully erase a portion of the one or more non-volatile memory devices, the erase operation duration statistics include the number of pulses (e.g., seven) applied to successfully erase the portion of the one or more non-volatile memory devices, or a unit of time (e.g., seconds, milliseconds, etc.) that corresponds to the number of pulses applied to successfully erase the portion of the one or more non-volatile memory devices. In some embodiments, the erase operation duration statistics are rounded up or down to predefined values (e.g., seconds, milliseconds, sets of ten pulses) and recorded as a rounded value. In some embodiments, the one or more erase statistics include an average duration for the multiple erase operations.

In some embodiments, the one or more erase statistics include erase success statistics, the erase success statistics indicating whether the portions of the one or more non-volatile memory devices have successfully completed one or more erase operations within a target erase duration. In some embodiments, the one or more erase statistics include erase success statistics, the erase success statistics indicating whether the portions of the one or more non-volatile memory devices have not successfully completed one or more erase operations within a target erase duration. In some embodiments, a portion of the one or more non-volatile memory devices is deemed to have successfully completed an erase operation in accordance with a determination that the portion of the one or more non-volatile memory devices is in a condition for receiving and storing data.

In some embodiments, the method includes, for each erase operation of the respective erase operations, updating (324) the one or more erase statistics. For example, in some embodiments, subsequent to a first erase operation performed on a first memory portion and a second erase operation performed on a second memory portion, one or more erase statistics corresponding to the first memory portion and one or more erase statistics corresponding to the second memory portion are updated.

In some embodiments, updating the one or more erase statistics that correspond to the performance of the multiple erase operations includes updating (326) at least one of the one or more erase statistics in accordance with how many erase operations, of the multiple erase operations, have a duration that exceeds a predefined duration threshold. For example, the storage device updates erase statistics to indicate that a particular number of erase operations (e.g., 137 out of 5000) performed on a first portion of the one or more non-volatile memory devices have taken more than a predefined duration threshold, such as eight voltage pulses or 3 milliseconds, to successfully erase the first portion. In some embodiments, determining how many erase operations, of the multiple erase operations, have durations that exceed a predefined duration threshold includes identifying the current set of erase parameters used for the multiple erase operations (e.g., 137 erase operations have taken more than 3 ms to successfully erase the first portion, using the fifth set of erase parameters).

In some embodiments, updating the one or more erase statistics that correspond to the performance of the multiple erase operations includes (328) identifying erase operations, of the multiple erase operations, whose durations exceed a predefined duration threshold, and updating at least one of the one or more erase statistics in accordance with the identified erase operations. For example, the storage device identifies that a specific number of erase operations (e.g., 137 of 5000) performed on a first portion of the one or more non-volatile memory devices have taken more than a predefined duration threshold, such as eight voltage pulses or 3 milliseconds, to successfully erase the first portion, and updates erase statistics to indicate the number of erase operations (e.g., 137) that have taken more than the predefined duration threshold for a successful erasure.

The method further includes, in accordance with a comparison of the erase statistics with an erasure performance threshold, establishing (330, FIG. 3D) a second set of erase parameters as the current set of erase parameters. For example, in some embodiments, in accordance with a determination that the erase statistics do not satisfy the erasure performance threshold, the storage device modifies the current set of erase parameters. In some embodiments, in accordance with a determination that the erase statistics satisfy the erasure performance threshold, the storage device forgoes modifying the current set of erase parameters (e.g., the storage device continues to use the current set of erase parameters for erase operations until the erase statistics no longer satisfy the erasure performance threshold).

In some embodiments, the method includes, in accordance with a determination that one or more erase statistics correspond to a rate or count of successful erase operations that equals or exceeds an erasure success threshold, establishing (332) the second set of erase parameters as the current set of erase parameters by decreasing one or both of an initial pulse voltage and an incremental pulse voltage of the current set of erase parameters. In some embodiments, successful erase operations include erase operations having erase durations less than a first duration threshold. For example, in some embodiments, in accordance with a determination that the erase statistics for the first portion of the one or more non-volatile memory devices indicate a 99.9% rate of erase success using the current set of erase parameters and the erase success threshold is 99%, the current set of erase parameters is updated to be another set of erase parameters that includes a lower initial pulse voltage and/or a lower incremental pulse voltage. In some embodiments, successful erase operations include erase operations that have completed successfully within a target erase duration.

In some embodiments, the method further includes, in accordance with a determination that one or more erase statistics corresponds to a rate or count of unsuccessful erase operations that equals or exceeds an erasure failure threshold, establishing (334) the second set of erase parameters as the current set of erase parameters by increasing one or both of an initial pulse voltage and an incremental pulse voltage of the current set of erase parameters. In some embodiments, unsuccessful erase operations include erase operations having erase durations greater than a second duration threshold. For example, if the erase statistics for the first portion of the one or more non-volatile memory devices indicate a 5% rate of erase failure using the current set of erase parameters, and the erase failure threshold is 1%, the current set of erase parameters is updated to be another set of erase parameters that includes a higher initial pulse voltage and/or a higher incremental pulse voltage. In some embodiments, unsuccessful erase operations include erase operations that have not completed successfully within a target erase duration.

In some embodiments, successful erase operations include erase operations having erase durations less than a first duration threshold, and the method includes, in accordance with a determination that one or more erase statistics corresponds to a rate or count of successful erase operations that does not meet an erasure success threshold, establishing the second set of erase parameters as the current set of erase parameters by increasing one or both of an initial pulse voltage and an incremental pulse voltage of the current set of erase parameters. For example, if the erase statistics for the first portion of the one or more non-volatile memory devices indicate a 95% rate of erase success using the current set of erase parameters, and the erase success threshold is 99%, the current set of erase parameters is updated to be another set of erase parameters that utilizes a higher initial pulse voltage and/or a higher incremental pulse voltage.

In some embodiments, the method includes, identifying (336, FIG. 3E) one or more portions of the one or more non-volatile memory devices that fail to satisfy a predefined erasure performance requirement when one or more erase operations are performed using the first set of erase parameters; subsequent to identifying the one or more portions of the one or more non-volatile memory devices, forgoing (338) erase operations on the one or more portions of the one or more non-volatile memory devices using the first set of erase parameters; and, subsequent to establishing the second set of erase parameters as the current set of erase parameters, performing (340) an erase operation on at least a subset of the identified one or more portions of the one or more non-volatile memory devices using the second set of erase parameters. For example, a first portion of a non-volatile memory device that failed to be erased after repeated erase operations using the first set of erase parameters is identified. In this same example, the identified portion does not have any more erase operations performed on it using the first set of erase operations. In this example, the first portion is set aside to be erased with the second set of erase parameters.

Alternatively, in some embodiments, the method includes, subsequent to establishing the second set of erase parameters as the current set of erase parameters, performing an erase operation on at least a subset of the identified one or more portions of the one or more non-volatile memory devices using a third set of erase parameters. The third set of erase parameters is distinct from the first set of erase parameters or the second set of erase parameters. Continuing from the previous example, if the identified portion is determined to require a set of erase parameters that include a higher initial pulse voltage and/or incremental pulse voltage than found in the second set of erase parameters, the identified portion is set aside to be erased with a third set of erase parameters.

In some embodiments, the method is performed (342, FIG. 3F) by a non-volatile memory controller (e.g., NVM controller 130-1, FIG. 1A) of the storage device (e.g., storage device 120, FIG. 1A) and the one or more erase statistics correspond to performance of multiple erase operations on portions of one or more non-volatile memory devices coupled to the non-volatile memory controller (e.g., non-volatile memory devices 140, FIG. 1A).

In some embodiments, the storage device (e.g., storage device 120, FIG. 1A) includes (344) a plurality of non-volatile memory controllers (e.g., NVM controllers 130-1 and 130-2, FIG. 1A), each coupled to a distinct set of one or more non-volatile memory devices (e.g., non-volatile memory devices 140, 142, FIG. 1A) in the storage device, and the method is performed independently by each non-volatile memory controller of the plurality of non-volatile memory controllers of the storage device. For example, in some embodiments, NVM controller 130-1 and NVM controller 130-2, shown in FIG. 1A, perform the above-described method independent of each other.

In some embodiments, multiple sets of erase parameters, including the first set of erase parameters and the second set of erase parameters, are stored (346) in non-volatile memory of the storage device (e.g., erase parameter set 220-1 through 220-L in memory 206, FIG. 2).

In some implementations, with respect to any of the methods described above, a non-volatile memory corresponds to a single flash memory device, while in other implementations, the non-volatile memory includes a plurality of flash memory devices.

In some implementations, with respect to any of the methods described above, a storage device includes (1) an interface for coupling the storage device to a host system, (2) one or more controllers, each of the one or more controllers configured to perform or control performance of any of the methods described above.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method of erasing data in a storage device, the storage device having one or more non-volatile memory devices, the method comprising:

performing a plurality of memory operations including read operations and a first set of erase operations on portions of the one or more non-volatile memory devices specified by the read operations and the first set of erase operations, wherein the first set of erase operations are performed using a first set of erase parameters that has been established as a current set of erase parameters prior to performing the first set of erase operations;

in accordance with each erase operation of at least a subset of the first set of erase operations, updating one or more erase statistics that correspond to performance of multiple erase operations;

in accordance with a comparison of the erase statistics with an erasure performance threshold, establishing a second set of erase parameters as the current set of erase parameters; and subsequent to establishing the second set of erase parameters as the current set of erase parameters, performing a subsequent erase operation on one or more portions of the one or more non-volatile memory devices using the second set of erase parameters;
wherein
the method includes generating a count of how many erase operations of the multiple erase operations have durations that exceed a predefined duration threshold, wherein each erase operation erases one or more blocks of memory cells; and
a respective erase statistic of the erase statistics corresponds to the count of how many erase operations of the multiple erase operations have durations that exceed the predefined duration threshold.

2. The method of claim 1, wherein the one or more erase statistics include erase operation duration statistics with respect to durations for the multiple erase operations.

3. The method of claim 1, including, for each erase operation of the first set of erase operations, updating the one or more erase statistics.

4. The method of claim 1, wherein updating the one or more erase statistics that correspond to the performance of the multiple erase operations includes identifying erase operations, of the multiple erase operations, whose durations exceed a predefined duration threshold, and updating at least one of the one or more erase statistics in accordance with the identified erase operations.

5. The method of claim 1, wherein the first set of erase parameters includes an initial pulse voltage and an incremental pulse voltage.

6. The method of claim 1, including, in accordance with a determination that one or more of the erase statistics correspond to a rate or count of successful erase operations that equals or exceeds an erasure success threshold, establishing the second set of erase parameters as the current set of erase parameters by decreasing one or both of: an initial pulse voltage and an incremental pulse voltage of the current set of erase parameters.

7. The method of claim 1, including, in accordance with a determination that one or more of the erase statistics correspond to a rate or count of unsuccessful erase operations that equals or exceeds an erasure failure threshold, establishing the second set of erase parameters as the current set of erase parameters by increasing one or both of: an initial pulse voltage and an incremental pulse voltage of the current set of erase parameters.

8. The method of claim 1, wherein each erase operation of the first set of erase operations includes:
applying a first voltage pulse to one or more portions of the one or more non-volatile memory devices in accordance with the current set of erase parameters; and,
in accordance with a determination that the one or more portions of the one or more non-volatile memory devices have not been successfully erased, applying one or more subsequent voltage pulses in accordance with the current set of erase parameters until predefined criteria have been met, the predefined criteria including that the one or more portions of the one or more non-volatile memory devices have been successfully erased.

9. The method of claim 1, wherein each erase operation of the first set of erase operations includes:
applying a set of voltage pulses to one or more portions of the one or more non-volatile memory devices in accordance with the current set of erase parameters; and,
in accordance with a determination that the one or more portions of the one or more non-volatile memory devices have not been successfully erased, applying one or more subsequent sets of voltage pulses to the one or more portions of the one or more non-volatile memory devices until second predefined criteria have been met, the second predefined criteria including that the one or more portions of the one or more non-volatile memory devices have been successfully erased.

10. The method of claim 9, further comprising:
receiving one or more host read commands to read data from one or more memory blocks on the storage device; and,
prior to applying the one or more subsequent sets of voltage pulses to the one or more portions of the one or more non-volatile memory devices, processing at least a subset of the one or more host read commands to read data from the one or more memory blocks on the storage device.

11. The method of claim 1, further comprising:
identifying one or more portions of the one or more non-volatile memory devices that fail to satisfy a predefined erasure performance requirement when one or more erase operations are performed using the first set of erase parameters;
subsequent to identifying the one or more portions of the one or more non-volatile memory devices, forgoing erase operations on the one or more portions of the one or more non-volatile memory devices using the first set of erase parameters; and,
subsequent to establishing the second set of erase parameters as the current set of erase parameters, performing the subsequent erase operation on at least a subset of the identified one or more portions of the one or more non-volatile memory devices using the second set of erase parameters.

12. The method of claim 1, wherein the method is performed by a non-volatile memory controller of the storage device and the one or more erase statistics correspond to performance of multiple erase operations on portions of one or more non-volatile memory devices coupled to the non-volatile memory controller.

13. The method of claim 1, wherein the storage device comprises a plurality of non-volatile memory controllers, each coupled to a distinct set of one or more non-volatile memory devices in the storage device, and the method is performed independently by each non-volatile memory controller of the plurality of non-volatile memory controllers of the storage device.

14. The method of claim 1, wherein the one or more non-volatile memory devices comprise one or more flash memory devices.

15. The method of claim 1, wherein multiple sets of erase parameters, including the first set of erase parameters and the second set of erase parameters, are stored in non-volatile memory of the storage device.

16. A storage device, having one or more non-volatile memory devices, comprising:
an interface for coupling the storage device to a host system; and
one or more controllers, each of the one or more controllers configured to:
perform a plurality of memory operations including read operations and a first set of erase operations on portions of the one or more non-volatile memory devices specified by the read operations and the first set of erase operations, wherein the first set of erase operations are performed using a first set of erase parameters that has been established as a current set of erase parameters prior to performing the respective erase operations;

in accordance with each erase operation of at least a subset of the first set of erase operations, update one or more erase statistics that correspond to performance of multiple erase operations;

in accordance with a comparison of the erase statistics with an erasure performance threshold, establish a second set of erase parameters as the current set of erase parameters; and subsequent to establishing the second set of erase parameters as the current set of erase parameters, performing a subsequent erase operation on one or more portions of the one or more non-volatile memory devices using the second set of erase parameters;

wherein the method includes generating a count of how many erase operations of the multiple erase operations have durations that exceed a predefined duration threshold, wherein each erase operation erases one or more blocks of memory cells; and a respective erase statistic of the erase statistics corresponds to the count of how many erase operations of the multiple erase operations have durations that exceed the predefined duration threshold.

17. The storage device of claim 16, wherein the one or more erase statistics include erase operation duration statistics with respect to durations for the multiple erase operations.

18. The storage device of claim 16, wherein each of the one or more controllers is further configured to, for each erase operation of the first set of erase operations, update the one or more erase statistics.

19. A non-transitory computer readable storage medium, storing one or more programs for execution by one or more processors of a storage device having one or more controllers, the one or more programs including instructions for:

performing a plurality of memory operations including read operations and a first set of erase operations on portions of the one or more non-volatile memory devices specified by the read operations and the first set of erase operations, wherein the respective erase operations are performed using a first set of erase parameters that has been established as a current set of erase parameters prior to performing the first set of erase operations;

in accordance with each erase operation of at least a subset of the first set of erase operations, updating one or more erase statistics that correspond to performance of multiple erase operations;

in accordance with a comparison of the erase statistics with an erasure performance threshold, establishing a second set of erase parameters as the current set of erase parameters; and subsequent to establishing the second set of erase parameters as the current set of erase parameters, performing a subsequent erase operation on one or more portions of the one or more non-volatile memory devices using the second set of erase parameters;

wherein the method includes generating a count of how many erase operations of the multiple erase operations have durations that exceed a predefined duration threshold, wherein each erase operation erases one or more blocks of memory cells; and a respective erase statistic of the erase statistics corresponds to the count of how many erase operations of the multiple erase operations have durations that exceed the predefined duration threshold.

20. The non-transitory computer readable storage medium of claim 19, wherein the one or more programs include instructions for: in accordance with a determination that one or more erase statistics corresponds to a rate or count of successful erase operations that equals or exceeds an erasure success threshold, establishing the second set of erase parameters as the current set of erase parameters by decreasing one or both of: an initial pulse voltage and an incremental pulse voltage of the current set of erase parameters.

21. The non-transitory computer readable storage medium of claim 19, wherein each erase operation of the first set of erase operations includes:

applying a first voltage pulse to one or more portions of the one or more non-volatile memory devices in accordance with the current set of erase parameters; and, in accordance with a determination that the one or more portions of the one or more non-volatile memory devices have not been successfully erased, applying one or more subsequent voltage pulses in accordance with the current set of erase parameters until predefined criteria have been met, the predefined criteria including that the one or more portions of the one or more non-volatile memory devices have been successfully erased.

22. The non-transitory computer readable storage medium of claim 19, wherein the one or more programs include instructions for:

identifying one or more portions of the one or more non-volatile memory devices that fail to satisfy a predefined erasure performance requirement when one or more erase operations are performed using the first set of erase parameters;

subsequent to identifying the one or more portions of the one or more non-volatile memory devices, forgoing erase operations on the one or more portions of the one or more non-volatile memory devices using the first set of erase parameters; and, subsequent to establishing the second set of erase parameters as the current set of erase parameters, performing an erase operation on at least a subset of the identified one or more portions of the one or more non-volatile memory devices using the second set of erase parameters.

23. The storage device of claim 16, including, in accordance with a determination that one or more erase statistics corresponds to a rate or count of successful erase operations that equals or exceeds an erasure success threshold, establishing the second set of erase parameters as the current set of erase parameters by decreasing one or both of: an initial pulse voltage and an incremental pulse voltage of the current set of erase parameters.

24. The storage device of claim 16, wherein each erase operation of the first set of erase operations includes:

applying a first voltage pulse to one or more portions of the one or more non-volatile memory devices in accordance with the current set of erase parameters; and, in accordance with a determination that the one or more portions of the one or more non-volatile memory devices have not been successfully erased, applying one or more subsequent voltage pulses in accordance with the current set of erase parameters until predefined criteria have been met, the predefined criteria including that the one or more portions of the one or more non-volatile memory devices have been successfully erased.

25. The storage device of claim 16, having one or more non-volatile memory devices, comprising:
an interface for coupling the storage device to a host system; and
one or more controllers, each of the one or more controllers further configured to:
identify one or more portions of the one or more non-volatile memory devices that fail to satisfy a predefined erasure performance requirement when one or more erase operations are performed using the first set of erase parameters;
subsequent to identifying the one or more portions of the one or more non-volatile memory devices, forgo erase operations on the one or more portions of the one or more non-volatile memory devices using the first set of erase parameters; and,
subsequent to establishing the second set of erase parameters as the current set of erase parameters, perform an erase operation on at least a subset of the identified one or more portions of the one or more non-volatile memory devices using the second set of erase parameters.

* * * * *